United States Patent
Hou

(10) Patent No.: US 10,989,831 B2
(45) Date of Patent: Apr. 27, 2021

(54) DETERMINING PERMEABILITY IN SUBSURFACE ANISOTROPIC FORMATIONS

(71) Applicant: Halliburton Energy Services, Inc., Houston, TX (US)

(72) Inventor: Junsheng Hou, Kingwood, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 329 days.

(21) Appl. No.: 15/779,963

(22) PCT Filed: Oct. 14, 2016

(86) PCT No.: PCT/US2016/057138
§ 371 (c)(1),
(2) Date: May 30, 2018

(87) PCT Pub. No.: WO2017/131825
PCT Pub. Date: Aug. 3, 2017

(65) Prior Publication Data
US 2018/0348396 A1     Dec. 6, 2018

(51) Int. Cl.
*G01V 3/38* (2006.01)
*G01R 33/12* (2006.01)
(Continued)

(52) U.S. Cl.
CPC .............. *G01V 3/38* (2013.01); *E21B 47/26* (2020.05); *E21B 49/00* (2013.01);
(Continued)

(58) Field of Classification Search
CPC . G01V 3/38; G01V 3/18; E21B 47/26; G01R 33/1223
See application file for complete search history.

(56) References Cited

U.S. PATENT DOCUMENTS

| | | |
|---|---|---|
| 5,663,499 A | 9/1997 | Semmelbeck et al. |
| 7,157,915 B2 | 1/2007 | Schoen et al. |

(Continued)

FOREIGN PATENT DOCUMENTS

| | | |
|---|---|---|
| WO | WO 2015/051300 A1 | 4/2015 |
| WO | WO 2015/161282 A1 | 10/2015 |

OTHER PUBLICATIONS

Adams (MIT), 2013, Permeability anisotropy and resistivity anisotropy of mudrocks.

(Continued)

*Primary Examiner* — Lisa E Peters

(57) ABSTRACT

A method and system can include a sensor positioned in a borehole, characteristics of the earthen formation can be measured and logged by the sensor, and an effective permeability can be determined based on the logged characteristics. Multi-component induction (MCI) data can be measured by a logging tool, 3D resistivity components can be determined by inverting the MCI data, and the 3D resistivity components can be logged. Tri-axial permeability components can be determined based on the effective permeability and the 3D resistivity component logs. A permeability of sand in the earthen formation can be determined based on the tri-axial permeability components, the effective permeability, and a laminated shale volume. The sand permeability can be logged and modifications to operation(s) can be initiated based on the sand permeability.

21 Claims, 13 Drawing Sheets

(51) Int. Cl.
  G01V 3/26    (2006.01)
  G01V 3/32    (2006.01)
  G01V 3/18    (2006.01)
  E21B 47/26   (2012.01)
  E21B 49/00   (2006.01)
  G01V 3/34    (2006.01)
  G01V 11/00   (2006.01)

(52) U.S. Cl.
  CPC .......... *G01R 33/1223* (2013.01); *G01V 3/18* (2013.01); *G01V 3/26* (2013.01); *G01V 3/32* (2013.01); *G01V 3/34* (2013.01); *E21B 2200/20* (2020.05); *G01V 11/00* (2013.01)

(56) References Cited

U.S. PATENT DOCUMENTS

| | | | | |
|---|---|---|---|---|
| 2002/0128777 | A1* | 9/2002 | Fanini | G01V 1/30 702/11 |
| 2002/0133323 | A1* | 9/2002 | Dahlberg | G01V 11/00 703/10 |
| 2003/0222651 | A1* | 12/2003 | Tabanou | G01V 11/002 324/367 |
| 2005/0075789 | A1* | 4/2005 | Xiao | G01V 11/00 702/6 |
| 2009/0145600 | A1 | 6/2009 | Wu et al. | |
| 2010/0185393 | A1* | 7/2010 | Liang | G01V 3/28 702/7 |
| 2010/0230095 | A1 | 9/2010 | Yin | |
| 2013/0073206 | A1 | 3/2013 | Hou et al. | |
| 2014/0074406 | A1* | 3/2014 | Skelt | G01V 11/002 702/11 |
| 2016/0018553 | A1* | 1/2016 | Celepcikay | G01V 3/28 324/339 |

OTHER PUBLICATIONS

Aldred, R.D., 2015, 3D petrophysical modeling to resolve complex reservoir interpretation problems: A case study from South East Asia: SPE 176243.
Georgi, D. et al., 2002, On the relationship between resistivity and permeability anisotropy: SPE 77715.
Hagiwara, T. 2015, To estimate permeability anisotropy from resistivity anisotropy: Resistivity SIG meeting in Apr. 22, 2015, Houston, USA.
Hou et al., 2015, Characterization of formation fractures with multicomponent induction logging based on biaxial anisotropy models: method and case studies: SPWLA 56th Annual Logging Symposium, paper FF.
International Search Report and the Written Opinion of the International Search Authority, or the Declaration, dated Sep. 12, 2016, PCT/US2016/014679, 11 pages, ISA/KR.
International Search Report and the Written Opinion of the International Search Authority, or the Declaration, dated Feb. 2, 2017, PCT/US2016/057138, 16 pages, ISA/KR.
Klein et al., 1995, The petrophysics of electrically anisotropic reservoirs: SPWLA 36th Annual Logging Symposium, Paper HH.
Moran et al., EE, 1962, Theoretical analysis of pressure phenomena associated with wireline formation tester: Journal of petroleum technology, v14, 899-908.
Oyewole et al., 2016, A new method for assessment of directional permeability and conductive pore network using electrical conductance in porous media: SPWLA 57th Annual Logging Symposium, paper TT.
Srisutthiyakorn et al., 2015, An improved Kozeny-Carman for irregular pore geometries: SEG extended abstract.
Tittman, 1990, Formation anisotropy: Reckoning with its effects. Schlumberger Oilfield Review, vol. 2(1), 16-23.
Wyllie et al., MB, 1952, Application of electrical resistivity measurements to problem of fluid flow in porous media: Bulletin of the American association of petroleum geologists: v36, 359-403.

* cited by examiner

US 10,989,831 B2

DETERMINING PERMEABILITY IN SUBSURFACE ANISOTROPIC FORMATIONS

PRIORITY

The present application is a U.S. National Stage patent application of International Patent Application No. PCT/US2016/057138, filed on Oct. 14, 2016, which is a continuation-in-part of International Patent Application No. PCT/US2016/014679, entitled, "PERMEABILITY ANISOTROPY ASSESSMENT IN SUBSURFACE ANISOTROPIC FORMATIONS," filed on Jan. 25, 2016, naming Junsheng Hou, Natasa Mekic, and John Quirein as inventors, the benefit of which is claimed and the disclosures of which are incorporated herein by reference in its entirety.

TECHNICAL FIELD

The present disclosure generally relates to oilfield applications and, in particular, to downhole tools, drilling and related systems, and techniques for determining a permeability of sand layers in a laminated sand-shale formation in response to resistivity measurements of subsurface anisotropic formations penetrated by a wellbore (or borehole).

BACKGROUND

Modern operations for the exploration and production of oil and gas rely on access to a variety of information regarding subsurface geological parameters and conditions. Such information typically includes characteristics of Earth formations traversed by a borehole, as well as data relating to the size and mud of the borehole itself. The collection of information relating to subsurface conditions, which is commonly referred to as "logging," can be performed by several methods, including wireline logging and logging while drilling (LWD).

In wireline logging, a sonde is lowered into the borehole after some or all of the well has been drilled. The sonde hangs at the end of a wireline cable that provides mechanical support to the sonde and also provides an electrical connection between the sonde and electrical equipment located at the surface. In accordance with existing logging techniques, various parameters of the Earth's formations are measured and correlated with the position of the sonde in the borehole as the sonde is pulled uphole. In LWD, a drilling assembly includes sensing instruments that measure various parameters as the formation is penetrated, thereby enabling measurement of the formation during the drilling operation.

Among the available wireline and LWD tools are a variety of logging tools including devices configured for taking multicomponent induction (MCI), nuclear magnetic resonance (NMR), and multi-pole sonic logging (MSL) measurements. Formation permeability can be characterized using such measurements. Current models can be used for the determination of permeability in isotropic formations. However, formation permeability can exhibit anisotropy in anisotropic formations and is often dependent upon the measuring direction.

Therefore, it will be readily appreciated that improvements in the arts of determining permeabilities of subsurface earthen formations surrounding a wellbore or borehole are continually needed.

BRIEF DESCRIPTION OF THE DRAWINGS

Various embodiments of the present disclosure will be understood more fully from the detailed description given below and from the accompanying drawings of various embodiments of the disclosure. In the drawings, like reference numbers may indicate identical or functionally similar elements. Embodiments are described in detail hereinafter with reference to the accompanying figures, in which.

DETAILED DESCRIPTION OF THE DISCLOSURE

Figure 1:
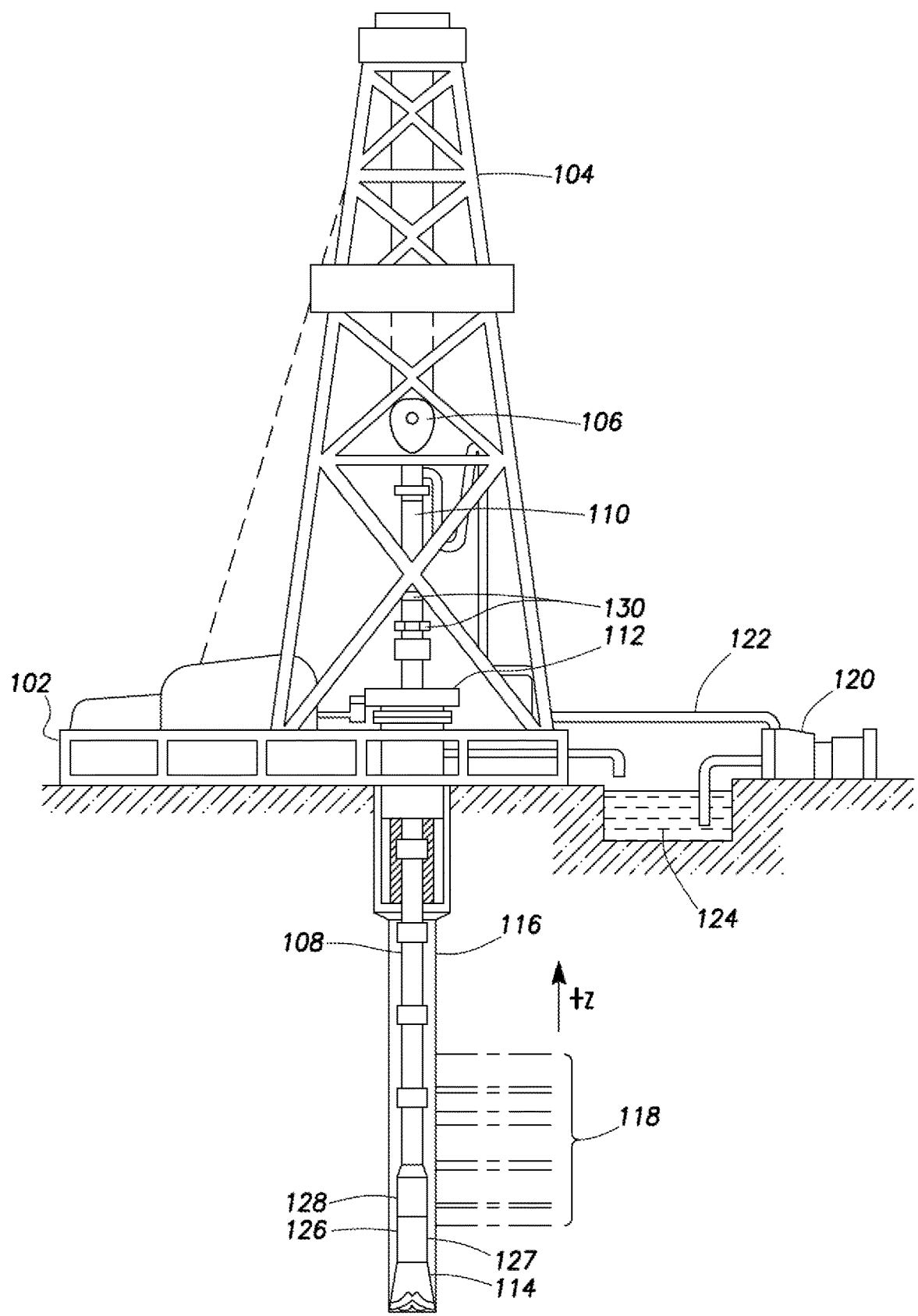
FIG. 1 is a representative partial cross-sectional view of a system for capturing subsurface measurement data in a logging while drilling (LWD) operation, according to one or more example embodiments.

The disclosure may repeat reference numerals and/or letters in the various examples or Figures. This repetition is for the purpose of simplicity and clarity and does not in itself dictate a relationship between the various embodiments and/or configurations discussed. Further, spatially relative terms, such as beneath, below, lower, above, upper, uphole, downhole, upstream, downstream, and the like, may be used herein for ease of description to describe one element or feature's relationship to another element(s) or feature(s) as illustrated, the upward direction being toward the top of the corresponding figure and the downward direction being toward the bottom of the corresponding figure, the uphole direction being toward the surface of the borehole, the downhole direction being toward the toe of the borehole. Unless otherwise stated, the spatially relative terms are intended to encompass different orientations of the apparatus in use or operation in addition to the orientation depicted in the Figures. For example, if an apparatus in the Figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Moreover even though a Figure may depict a horizontal borehole or a vertical borehole, unless indicated otherwise, it should be understood by those skilled in the art that the apparatus according to the present disclosure is equally well suited for use in boreholes having other orientations including vertical boreholes, slanted boreholes, multilateral boreholes or the like. Likewise, unless otherwise noted, even though a Figure may depict an onshore operation, it should be understood by those skilled in the art that the method and/or system according to the present disclosure is equally well suited for use in offshore operations and vice-versa. Further, unless otherwise noted, even though a Figure may depict a cased hole, it should be understood by those skilled in the art that the method and/or system according to the present disclosure is equally well suited for use in open hole operations.

As used herein, the words "comprise," "have," "include," and all grammatical variations thereof are each intended to have an open, non-limiting meaning that does not exclude additional elements or steps. While compositions and methods are described in terms of "comprising," "containing," or "including" various components or steps, the compositions and methods also can "consist essentially of" or "consist of" the various components and steps. It should also be understood that, as used herein, "first," "second," and "third," are assigned arbitrarily and are merely intended to differentiate between two or more objects, etc., as the case may be, and does not indicate any sequence. Furthermore, it is to be understood that the mere use of the word "first" does not require that there be any "second," and the mere use of the word "second" does not require that there be any "first" or "third," etc.

The terms in the claims have their plain, ordinary meaning unless otherwise explicitly and clearly defined by the patentee. Moreover, the indefinite articles "a" or "an," as used in the claims, are defined herein to mean one or more than one of the element that it introduces. If there is any conflict in the usages of a word or term in this specification and one or more patent(s) or other documents that may be incorporated herein by reference, the definitions that are consistent with this specification should be adopted.

The following detailed description refers to the accompanying drawings that depict various details of examples selected to show how aspects of this disclosure may be practiced. The discussion addresses various examples of the disclosed subject matter at least partially in reference to these drawings, and describes the depicted embodiments in sufficient detail to enable those skilled in the art to practice the subject matter disclosed herein. Many other embodiments may be utilized for practicing the disclosed subject matter other than the illustrative examples discussed herein, and structural and operational changes in addition to the alternatives specifically discussed herein may be made without departing from the scope of the disclosed subject matter.

Subsurface formations can exhibit the ability to allow formation fluids (e.g., oil, water, or gas) or multi-phase fluids to pass through it, referred to as formation permeability. Formation permeability is an important parameter in formation evaluation and reservoir characterization. For example, permeability information can be utilized for reservoir simulation, enhanced oil recovery, well completion design, and field exploitation/development strategies. Unlike isotropic petro-physical parameters such as porosity and saturation, formation permeability can be anisotropic in, for example, three common types of subsurface formations (e.g., laminated sand-shale sequences, sands with different grain sizes, and sand with thin resistive/conductive streaks). Thus, permeability is often strongly dependent on the measuring direction in the anisotropic formations.

Various interpretation models for deriving formation permeability from logging data (e.g., multicomponent induction [MCI], nuclear magnetic resonance [NMR], and multi-pole sonic logging [MSL]) have been developed. However, such models are typically used for determining permeability in isotropic formations. Current logging tools and their measured data may be used for determination of scalar or isotropic permeability. These conventional "log data-derived" permeabilities (i.e. permeabilities derived from data "logged" for the borehole, from samples with similar properties of the earthen formation surrounding the borehole, etc.) do not deliver permeability anisotropy and its components (such as horizontal and vertical permeabilities). Accurate determination of permeability that accounts for anisotropy can enhance formation evaluation and reservoir characterization.

Permeability can be determined using a permeability anisotropy model that is based at least in part on relationship between formation permeability and resistivity in transversely isotropic (TI) and bi-axially anisotropic (BA) formations. In MCI logging, formation resistivity (or conductivity, which is inversely related to resistivity) shows azimuthal anisotropy of horizontal resistivity in the bedding plane of formations. Unless the text or context clearly indicates otherwise, "horizontal" or "transverse" refers to a direction or plane substantially coinciding with a bedding plane of the relevant formation, and "vertical" means a direction of plane substantially orthogonal to the bedding plane of the relevant formation.

Processing of MCI logging data may be performed based at least in part on BA parameterization, resulting in a more accurate description of complex anisotropic formations than based on transversely isotropic (TI) models. The TI formation model is a model that represents simulated formation resistivity characteristics accounting for transverse formation isotropy to resistivity. The TI model can account for resistivity differences between orthogonal axes lying in a formation or bedding plane (e.g., the horizontal or transverse plane) and an axis perpendicular to the formation or bedding plane (e.g., the vertical axis). Thus, the TI model accounts for anisotropy between the vertical axis and the horizontal plane, but assumes isotropy between different axes in the horizontal plane. The BA model additionally accounts for anisotropy between orthogonal axes in the transverse plane.

One or more example embodiments described below provide a method and system for logging data processing in determining permeability anisotropy. The description of example embodiments that follow describes using the permeability anisotropy model to derive a relationship between formation permeability anisotropy and resistivity anisotropy in BA formations. As is known, MCI tools are capable of measuring data that can be used to determine 3D resistivity anisotropy in formations. An inversion of the MCI data can yield the 3D resistivity anisotropy. Additionally, an effective permeability or a permeability component can be used to calibrate conventional permeabilities (e.g., that account for scalar or isotropic permeability) derived from data logs for calculating the other permeability components. The limited vertical resolution of logging tools is sometimes unable to capture the reservoir (or sand) permeability in laminar formations. Thus, in some embodiments, the sand permeability is determined from calculating x-, y-, and z-axis direction permeability components based on a multi-modal permeability model, as discussed further below.

Implementations of the disclosed example embodiments can provide the permeability anisotropy by using an integrated interpretation of the MCI resistivity anisotropy measurements with conventional permeability logs from other sensors (e.g., resistivity, NMR, or sonic). Thus, tri-axial permeability components (for BA formations) of the permeability anisotropy tensor can be determined and applied to interpretations of field logging data.

FIG. 1 is a representative illustration of an example logging while drilling (LWD) environment. A drilling platform 102 can be equipped with a derrick 104 that supports a hoist 106 for raising and lowering a drill string 108. The hoist 106 suspends a top drive 110 suitable for rotating the drill string 108 and lowering the drill string 108 through the well head 112. Connected to the lower end of the drill string 108 can be a drill bit 114. As the drill bit 114 rotates, it creates a borehole (or wellbore) 116 that passes through various formations 118. A pump 120 can be used to circulate drilling fluid through a supply pipe 122 to top drive 110, down through the interior of drill string 108, through orifices in drill bit 114, back to the surface via an annulus around drill string 108, and into a retention pit 124. The drilling fluid transports cuttings from the borehole 116 into the pit 124 and aids in maintaining the integrity of the borehole 116. Various materials can be used for drilling fluid, including a salt-water based conductive mud.

An assembly of LWD tools 126, which can include one or more sensors 127, can be integrated into a bottom-hole assembly (BHA) near the bit 114. As the bit 114 extends the borehole 116 through the formations 118, LWD tools 126 can collect measurements relating to various formation properties as well as the tool orientation and various other drilling conditions. The LWD tools 126 can take the form of a drill collar, i.e., a thick-walled tubular that provides weight and rigidity to aid the drilling process. In various examples, the LWD tools 126 can include a multi-array tri-axial induction tool to measure formation resistivity and produce MCI measurement data, such as described further herein. Further, the LWD tools 126 can include one or more sensors 127, such as a NMR and/or a sonic logging tool, to measure and deliver logging data. A telemetry sub 128 can be included to transfer images and measurement data to a surface receiver and to receive commands from the surface. In some embodiments, the telemetry sub 128 does not communicate with the surface, but rather stores logging data for later retrieval at the surface when the logging assembly is recovered.

Figure 2:
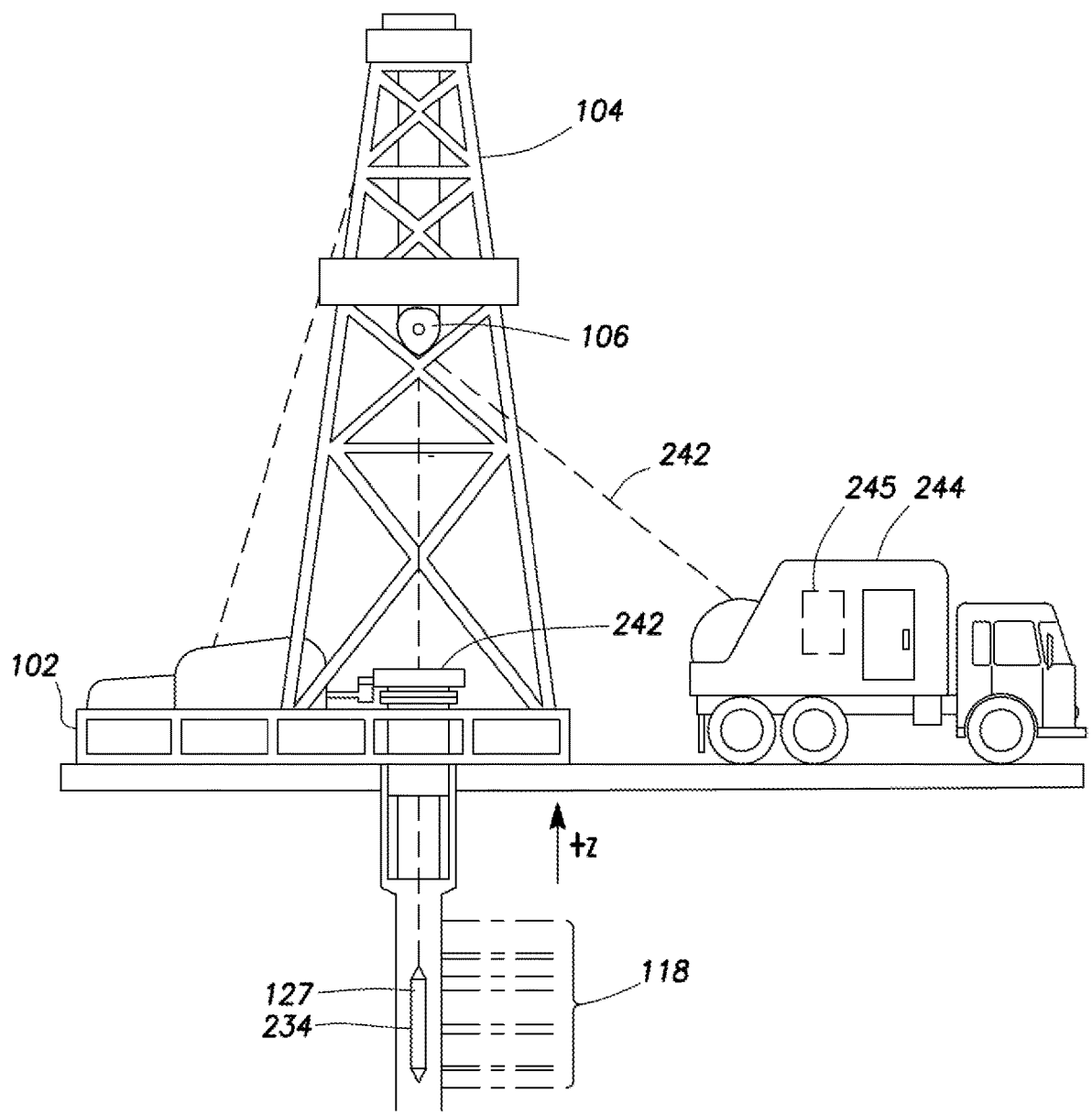
FIG. 2 is a representative partial cross-sectional view of a system for capturing subsurface measurement data in a wireline logging operation, according to one or more example embodiments.

At various times during (or after) the drilling process, the drill string 108 can be removed from the borehole 116 as shown in FIG. 2. Once the drill string 108 has been removed, logging operations can be conducted using a wireline logging sonde 234, which can be a probe suspended by a cable 242 having conductors for conducting power to the sonde 234, and for transmitting telemetry data from the sonde 234 to the surface. The example wireline logging sonde 234 can have pads and/or centralizing springs to maintain the sonde 234 near the central axis of the borehole 116 as sonde 234 is pulled uphole. Similar to the LWD tools, the logging sonde 234 can include a variety of sensors including a multi-array tri-axial induction tool for measuring formation resistivity and providing MCI measurement data. The logging sonde 234 can also include one or more sensors 127, such as a NMR and/or sonic logging tool, for measuring and providing measurement data. A logging facility 244 collects measurements from the logging sonde 234, and includes processing circuitry 245 for processing and storing the measurements gathered by the sensors 127 and other logging devices in the logging sonde 234.

Figure 3:
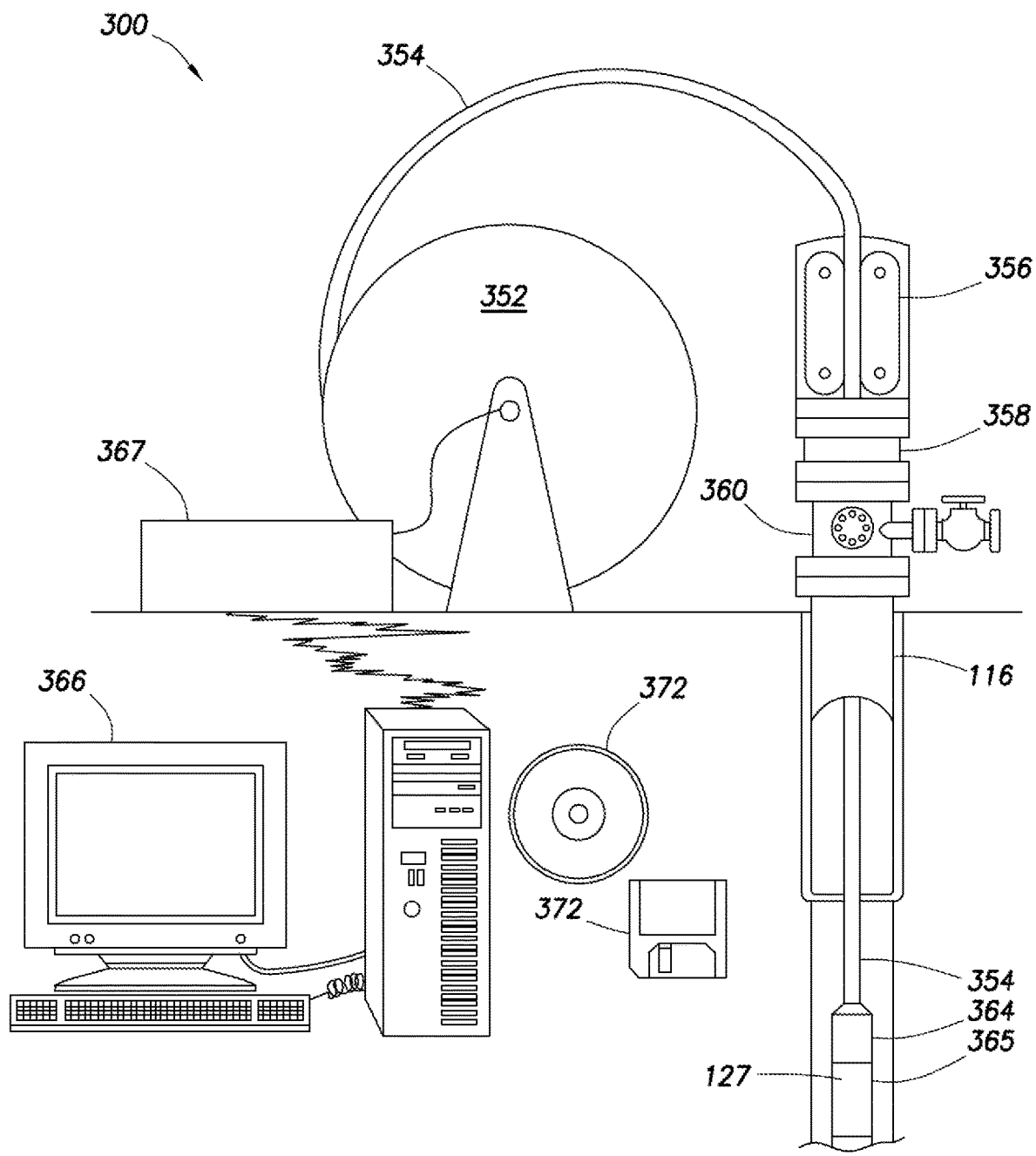
FIG. 3 is a representative partial cross-sectional view of a coiled tubing logging system for capturing subsurface measurement data, according to one or more example embodiments.

Yet a further alternative logging technique is schematically illustrated in FIG. 3, which shows an example embodiment of a coiled tubing logging system 300. In system 300, coiled tubing 354 is pulled from a spool 352 by a tubing injector 356 and injected through a packer 358 and a blowout preventer 360 into the borehole 116. In the borehole 116, a supervisory sub 364 and one or more logging tools 365, with one or more sensors 127, are coupled to the coiled tubing 354 and configured to communicate to a surface computer system 366 via information conduits or other telemetry channels. An uphole interface 367 may be provided to exchange communications with the supervisory sub 364 and receive data to be conveyed to the surface computer system 366.

Processing circuitry, in the form of a surface computer system 366, is configured to communicate with supervisory sub 364 to set logging parameters and collect logging information from the one or more logging tools 365. Surface computer system 366 is configured by software (shown in FIG. 3 as being stored on example embodiments of removable storage media 372) to monitor and control downhole instruments 364, 365. The surface computer system 366 may be a computer system such as that described further herein.

Forward modeling includes a numerical solution of Maxwell's equation in a mathematical boundary value problem, where the relevant formation or model specifies boundaries and shapes of regions of different resistivity. Processes for deriving formation parameters from a set of given field logs is known as inverse modeling, and typically comprises iteratively adjusting selected formation parameters in one or more layers of a formation model, and repeating forward modeling (e.g., by the calculation or with reference to pre-calculated library data), until the observed field logs are satisfactorily replicated, e.g. until a set of variable borehole-formation parameters is found for a best fit with the observed log data based on the applicable formation model.

Some of the example processing schemes disclosed herein are based at least in part on a bi-axial anisotropy (BA) model and/or a transversely isotropic (TI) model. The TI model can account for resistivity differences between orthogonal axes lying in a formation or bedding plane (sometimes referred to as the horizontal or transverse plane), and an axis perpendicular to the formation or bedding plane (sometimes referred to as the vertical axis). The TI model thus can account for anisotropy between the "vertical" axis and the "horizontal" plane, but assumes isotropy between different axes in the "horizontal" or transverse plane. For this reason, the TI model is also referred to being TI anisotropic.

The BA model additionally accounts for anisotropy between orthogonal axes in the transverse plane, and is therefore also referred to as accounting for tri-axial anisotropy. Note that, unless otherwise specified, "bi-axial anisotropy" and its derivations refer to transverse bi-axial anisotropy. Consistent with this terminology, a TI model does not account for bi-axial anisotropy, even though it accounts for anisotropy between two axes (e.g., between the horizontal plane and the vertical axis).

We describe formation resistivity/conductivity of BA in the formation's principal coordinate system. This system is chosen so that the x- or y-axis direction coincides with a conductivity tensor's principal axis having the largest conductivity (or smallest resistivity) component in the bedding plane; the z-axis is parallel to the conductivity principal axis having the smallest conductivity component in the bedding plane. In this principal axis coordinate system, the formation conductivity can be expressed as a diagonal tensor:

$$\bar{\sigma}_t = \text{diag}(C_x, C_y, C_z), \quad (1)$$

where $\bar{\sigma}$ is the formation conductivity tensor, its elements $C_x$ and $C_y$ are the two conductivities in the two principal-axis (e.g., x- and y-axes) in the bedding plane, and $C_z$ is the conductivity in the principal-axis direction (e.g., z-axis) perpendicular to the bedding plane.

If equation (1) is expressed in resistivity terms, the formation resistivity can be expressed as the following diagonal tensor:

$$\bar{R}_t = \text{diag}(R_x, R_y, R_z), \quad (2)$$

where $\bar{R}_t$ is the formation resistivity tensor, and its elements $R_x$, $R_y$, and $R_z$ are the tri-axial resistivity components in the three principal-axis directions (x, y, and z), respectively. It is noted that in a TI formation, resistivity can be represented as a diagonal tensor that is only described using two resistivity components: $R_h$ (wherein $R_h = R = R_y$) and $R_v$ (wherein $R_v = R_z$) in the principal axis system (e.g., x-y-z coordinate system), however, the resistivity tensor of the BA model is best described using the tri-axial resistivity components: $R_x$, $R_y$, and $R_z$.

Based on equations (1) and (2), one can derive the relations among resistivity and conductivity components $R_x = 1/C_x$, $R_y = 1/C_y$, and $R_z = 1/C_z$. If $R_x = R_y = R_z$, then the formation resistivity is isotropic. If only $R_x = R_y \neq R_z$, then the formation resistivity is transversely isotropic (TI); therefore, only one resistivity component is necessary in the bedding plane. In this case, both $R_x$ and $R_y$ are usually called horizontal resistivity and are often denoted as $R_h$ $(=R_x=R_y)$; and, $R_z$ is called the vertical resistivity and is usually denoted as $R_v$. If $R_x \neq R_y \neq R_z$, the formation resistivity is of bi-axial anisotropy (BA). It can be seen that the isotropy and transverse isotropy are special cases of the bi-axial anisotropy (BA). For practical applications, different ratio notations are used. For example, ratios $R_{xy} = R_x/R_y$, $R_{zx} = R_z/R_x$ and $R_{zy} = R_z/R_y$.

As discussed herein, when permeability is anisotropic, a permeability tensor (as opposed to a scalar) is used for expressing the formation permeability. Pressure in formations can be applied in three directions, and for each direction, the permeability can be measured (via Darcy's law) in three directions, thus leading to a 3 by 3 tensor. A differential form of Darcy's law can be expressed as a matrix equation in a three-dimensional (3D) space as given by: $\vec{q} = K\vec{G}$ where $\vec{q}$ is the so-called Darcy velocity vector, $\vec{G}$ is a modified pressure gradient vector, and K is the formation permeability, and K is a second-rank tensor. This equation shows that pressure can be applied in three orthogonal directions, and for each direction, the permeability can be measured in three directions. In a three-dimensional (3D) coordinate system, the second-rank tensor can be realized using a 3 by 3 matrix being both symmetric and positive definite, and can be represented using the following equation:

$$K = \begin{pmatrix} k_{xx} & k_{xy} & k_{xz} \\ k_{xy} & k_{yy} & k_{yz} \\ k_{xz} & k_{yz} & k_{zz} \end{pmatrix} = (k_{ij})_{3 \times 3} \quad (3)$$

In equation (3), K is the true formation permeability tensor, i denotes the pressure direction, and j is the permeability measurement direction. Therefore, component $k_{ij}$ represents the j-th directional permeability component at the i-th pressure direction. This permeability tensor K is diagonalizable (as it is both symmetric and positive definite). The eigenvectors will yield the principal directions of flow, representing the directions where flow is parallel to the pressure drop, and the three eigenvectors represent the three principal permeability components.

In the 3D principal coordinate system, the permeability tensor K is expressed as a diagonal tensor after the matrix diagonalization, which is equivalent to finding the matrix's eigenvectors, and can be represented using the following equation:

$$K = \text{diag}(k_x, k_y, k_z) \quad (4)$$

In equation (4), $k_x$ and $k_y$ are the two permeability components in the two principal axis (X and Y) directions of the bedding plane, and $k_z$ is the permeability component in the Z principal axis direction perpendicular to the bedding plane. Similar to the formation resistivity descriptions, the formation permeability is isotropic if $k_x = k_y = k_z$. If $k_x = k_y \neq k_z$, then the permeability is transversely isotropic (TI). In the TI formation, only two components are needed for describing the formation permeability anisotropy. In the bedding plane, the permeability component can be denoted as $k_x = k_y = k_h$ and is referred to as the horizontal permeability. For the Z-directional component, $k_z$, can be denoted as $k_z = k_v$ and is referred to as the vertical permeability. Thus, the permeability tensor can also be represented using the equation: $K = \text{diag}(k_h, k_h, k_v)$. When $k_x \neq k_y \neq k_z$, the permeability is of bi-axial anisotropy (BA).

In electrically anisotropic formations, the resistivity anisotropy can be obtained from induction logs, such as MCI logs. If formations are both permeability and resistivity anisotropic, the permeability anisotropy can be evaluated from the resistivity anisotropy. It can be assumed that the pore space is represented as a bundle of independent and tortuous tubes of different radii in isotropic formations. If the flow rate is low enough that it is laminar and not turbulent, then the permeability scalar can be determined by using the following Kozeny-Carman equation:

$$k = A \cdot \frac{d^2}{4F} = A \cdot d^2 \cdot \frac{I \cdot R_w}{4R_t} \quad (5)$$

where k represents the permeability in an isotropic formation, A represents a shape factor for the pore tubes with a diameter of d, and F represents the formation factor.

The formation factor can be represented using the following equation:

$$F = \frac{R_o}{R_w} = \frac{R_t}{I \cdot R_w} \quad (6)$$

where $R_o$ represents the 100% water-bearing formation resistivity, $R_w$ represents the formation water resistivity, $R_t$ represents the true formation resistivity, and I represents the resistivity index.

The resistivity index can be represented using the following equation:

$$I = \frac{R_t}{R_o} \quad (7)$$

In BA formations, the permeability, formation factor, and resistivity (or conductivity) index are not scalars. Instead, the permeability, formation factor, and resistivity (or conductivity) index can be represented using tensors, namely: K, F, and I, respectively. Similar to K as given above in equation (4), F and I can be represented using the following two diagonal tensor equations in the same 3D principal system:

$$F = \mathrm{diag}(F_x, F_y, F_z) \quad (8)$$

$$I = \mathrm{diag}(I_x, I_y, I_z) \quad (9)$$

A generalization of all the values for anisotropic formations yields the tensor expressions. For example, the following equations represent permeability components in BA formations:

$$k_x = A_x \cdot d_x^2 \cdot \frac{1}{4F_x} = A_x \cdot d_x^2 \cdot \frac{I_x \cdot R_w}{4R_x} \quad (10)$$

$$k_y = A_y \cdot d_y^2 \cdot \frac{1}{4F_y} = A_y \cdot d_y^2 \cdot \frac{I_y \cdot R_w}{4R_y} \quad (11)$$

$$k_z = A_z \cdot d_z^2 \cdot \frac{1}{4F_z} = A_z \cdot d_z^2 \cdot \frac{I_z \cdot R_w}{4R_z} \quad (12)$$

where $F_x$, $F_y$, and $F^z$ represent three formation factor components measured along the x-, y-, and z-axis directions, respectively, which can be represented by $$F_x = \frac{R_x}{I_x \cdot R_w},\ F_y = \frac{R_y}{I_y \cdot R_w},\ \text{and}\ F_z = \frac{R_z}{I_z \cdot R_w}.$$

The three components of the resistivity index tensor, I, can be represented by $$I_x = \frac{R_x}{R_O^x},\ I_y = \frac{R_y}{R_O^y},\ \text{and}\ I_z = \frac{R_z}{R_O^z},$$

where $R_x$, $R_y$, and $R_z$ represent the x-, y-, and z-axis formation resistivity components, respectively.

In BA permeability formations, the relationship between permeability and formation resistivity factor obtained along three perpendicular principal-axis directions (e.g., x-, y-, and z-axis) can be represented using the following equations. The anisotropy $$\frac{k_x}{k_z}$$

can be determined by equation (13) and the anisotropy $$\frac{k_y}{k_z}$$

can be determined by equation (14):

$$\frac{k_x}{k_z} = \frac{A_x \cdot d_x^2}{A_z \cdot d_z^2} \cdot \left(\frac{F_z}{F_x}\right) \quad (13)$$

$$\frac{k_y}{k_z} = \frac{A_y \cdot d_y^2}{A_z \cdot d_z^2} \cdot \left(\frac{F_z}{F_y}\right) \quad (14)$$

Alternatively, the relationship between permeability anisotropy and resistivity (or conductivity) anisotropy can be represented using the following equations:

$$\frac{k_x}{k_z} = \frac{A_x \cdot d_x^2}{A_z \cdot d_z^2} \frac{I_x}{I_z} \cdot \left(\frac{R_z}{R_x}\right) = \frac{A_x \cdot d_x^2}{A_z \cdot d_z^2} \frac{I_x}{I_z} \cdot \left(\frac{C_x}{C_z}\right) = C_{RP}^{xz} \cdot \left(\frac{R_z}{R_x}\right) \quad (15)$$

$$\frac{k_y}{k_z} = \frac{A_y \cdot d_y^2}{A_z \cdot d_z^2} \frac{I_y}{I_z} \cdot \left(\frac{R_z}{R_y}\right) = \frac{A_y \cdot d_y^2}{A_z \cdot d_z^2} \frac{I_y}{I_z} \cdot \left(\frac{C_y}{C_z}\right) = C_{RP}^{yz} \cdot \left(\frac{R_z}{R_y}\right) \quad (16)$$

where $$C_{RP}^{xz} = \frac{A_x \cdot d_x^2}{A_z \cdot d_z^2} \frac{I_x}{I_z},\ C_{RP}^{yz} = \frac{A_y \cdot d_y^2}{A_z \cdot d_z^2} \frac{I_y}{I_z},$$

with $C_x$, $C_y$, and $C_z$ being the two horizontal conductivities (i.e. x- and y-axis), and vertical conductivity (i.e. z-axis), respectively. Two resistivity (or conductivity) anisotropy ratios can be defined as:

$$R_{zx} = \frac{R_z}{R_x} = \frac{C_x}{C_z} = C_{xz},\ R_{zy} = \frac{R_z}{R_y} = \frac{C_y}{C_z} = C_{yz}$$

and two permeability anisotropy ratios can be defined as:

$$k_{xz} = \frac{k_x}{k_z}\ \text{and}\ k_{yz} = \frac{k_y}{k_z}.$$

This permeability-resistivity anisotropy relationship shows that the permeability anisotropy can be evaluated based on resistivity anisotropy measurements (such as derived from MCI logs) and the pore shape and/or diameter. A simplified relationship between the permeability and resistivity anisotropy of equations (15), (16) can be determined if it is assumed that $A_x I_x = A_y I_y = A_z I_z$ and can be represented using the following equations:

$$\frac{k_x}{k_z} = \frac{d_x^2}{d_z^2} \cdot \left(\frac{R_z}{R_x}\right),\ \text{or}\ k_{xz} = C_{RP}^{xz} \cdot R_{zx},\ \text{or}\ R_{zx} = \frac{1}{C_{RP}^{xz}} k_{xz} \quad (17)$$

$$\frac{k_y}{k_z} = \frac{d_y^2}{d_z^2} \cdot \left(\frac{R_z}{R_y}\right),\ \text{or}\ k_{yz} = C_{RP}^{yz} \cdot R_{zy},\ \text{or}\ R_{zy} = \frac{1}{C_{RP}^{yz}} k_{yz} \quad (18)$$

-continued $$\frac{k_x}{k_y} = \frac{d_x^2}{d_y^2} \cdot \left(\frac{R_y}{R_x}\right), \text{ or } k_{xy} = C_{RP}^{xy} \cdot R_{yx}, \text{ or } R_{yx} = \frac{1}{C_{RP}^{xy}} k_{xy} \quad (19)$$

Further, if it is assumed that $$C_{RP}^{xz} = C_{RP}^{yz} = \frac{d_x^2}{d_z^2} = \frac{d_y^2}{d_z^2} = 1, \quad (20)$$

then equations (17), (18), and (19) can further be reduced and represented using the following equation:

$$\frac{k_h}{k_v} = \left(\frac{R_v}{R_h}\right) \quad (20)$$

Where, $k_h=k_x=k_y$, $k_v=k_z$, $R_h=R_x=R_y$, and $R_v=R_z$. From equation (20), the permeability anisotropy can be estimated if the resistivity anisotropy is known, such as from MCI log inversion processing.

An effective (or geometric mean) permeability in BA formations can be represented using the following equation:

$$k_e = \sqrt[3]{k_{he}^2 \cdot k_z} = \sqrt[3]{k_x \cdot k_y \cdot k_z} \quad (21)$$

Where, $k_{he}$ is an effective horizontal permeability that combines the $k_x$ and $k_y$ permeabilities.

The effective permeability, $k_e$, should fall between $k_{he}$ and $k_z$. It is noted that $k_{he}=k_z=k_e$ for isotropic media, and $k_{he}=\sqrt{k_x k_y}$. For core measurements, it is possible to measure one permeability component or multi-component permeability, such as $k_x$, $k_y$, $k_z$ or all different components. In one case, if it is assumed that the log data-derived permeabilities (e.g., using resistivity logs, sonic and/or NMR) are calibrated by $k_e$, then they are approximately equal to this effective permeability, $k_e$. In another case, if it is assumed that the log data-derived permeabilities are calibrated by $k_h$ or $k_v$, then they are approximately equal to the horizontal or vertical permeability, $k_h$ or $k_v$.

In general, $k_e$ and $k_{he}$ can be seen as two functions of a variable log data-derived permeability (e.g. from sensors 127). They can be represented using the following equations:

$$k_e = f_{log}^e(k_{log}) \quad (22)$$

$$k_{he} = f_{log}^{he}(k_{log}^h) \quad (23)$$

Here, $f_{log}^e(k_{log})$ and $f_{log}^{he}(k_{log}^h)$ are two known functions, $k_{log}$ and $k_{log}^h$ are two types of conventional log data-derived permeabilities.

In equation 22, if it is assumed that the log data-derived permeabilities $k_{log}$ are calibrated by $k_e$ (e.g., using resistivity logs, sonic and/or NMR, etc.), then they can be approximately expressed as $k_e=C_{log}^e \times k_{log}$, were $C_{log}^e$ is a known calibration coefficient. In Equation 23, if it is assumed that the log data-derived permeabilities are calibrated by $k_{he}$, then they can be approximately expressed as $k_{he}=C_{log}^{he} \times k_{log}^h$, were $C_{log}^{he}$ is also a known calibration coefficient. If it is assumed that $C_{RP}^{xy}=1$, $C_{RP}^{yz}=1$, and $C_{RP}^{yx}=1$ for BA formations, then a relationship between the permeability and resistivity anisotropy can be expressed by the following equations:

$$k_{xz} = \frac{k_x}{k_z} = \frac{R_z}{R_x} = R_{zx} \quad (24)$$

$$k_{yz} = \frac{k_y}{k_z} = \frac{R_z}{R_y} = R_{zy} \quad (25)$$

$$k_{yx} = \frac{k_y}{k_x} = \frac{R_x}{R_y} = R_{xy} \quad (26)$$

$$k_{xy} = \frac{k_x}{k_y} = \frac{R_y}{R_x} = R_{yx} = 1/R_{xy} \quad (27)$$

$$R_{zy} = R_{zx} \cdot R_{xy} \quad (28)$$

If it is assumed that the resistivity BA can be obtained from the MCI logs, then the permeabilities can be determined from the equations above if the log data-derived conventional permeabilities are equal to the effective permeability, $k_e$. When the tri-axial resistivity components ($R_x$, $R_y$, and $R_z$) and the effective perm $k_e$ (or one permeability component such as $k_x$), are determined, then the tri-axial permeability components ($k_x$, $k_y$, and $k_z$) plus bi-axial anisotropy permeability ratios $$\left(\text{e.g., } \frac{k_x}{k_y}, \frac{k_x}{k_z}, \text{ and } \frac{k_y}{k_z}\right)$$

can be determined. Thus, the following equations can be used for determining $k_x$, $k_y$ and $k_z$:

$$k_x = k_e \cdot \left(\frac{R_{zx}}{R_{xy}}\right)^{1/3} \quad (29)$$

$$k_y = k_e \cdot \left(\frac{R_{zy}}{R_{yx}}\right)^{1/3} \quad (30)$$

$$k_z = k_e \frac{1}{(R_{zx} \cdot R_{zy})^{1/3}} \quad (31)$$

Figure 4:
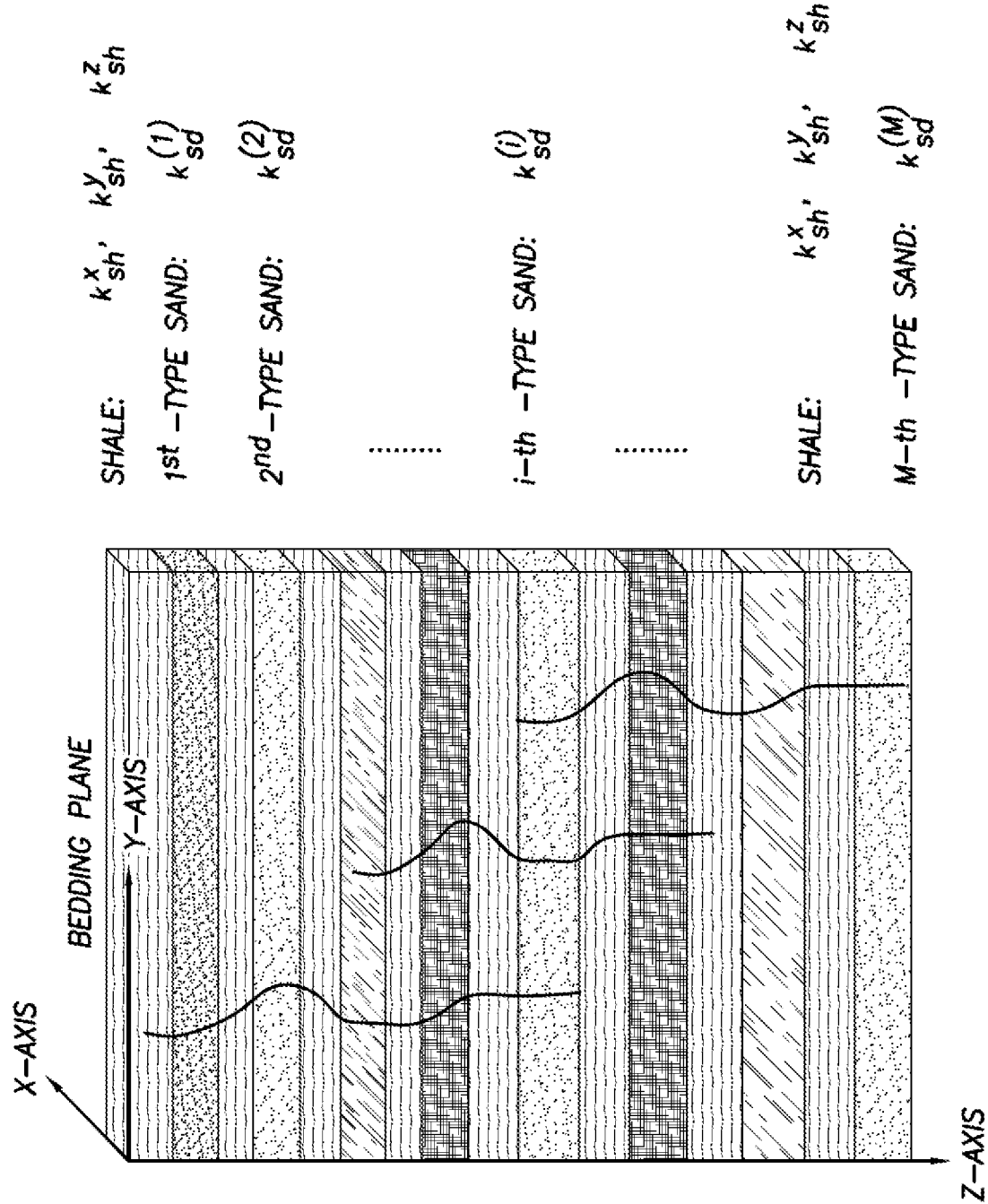
FIG. 4 is a diagram of a multi-component permeability model, according to one or more example embodiments.

It is known that the laminations in laminar reservoirs are often much thinner than a logging tool's vertical resolution. Therefore, the log data-derived permeabilities can be represented as weighted averages of true reservoir permeability and shale permeability. FIG. 4 is a diagram of a multi-component permeability model consisting of M-number types of isotropic sands and one type of BA shale. In the model, $k_{sd}^{(i)}$ is the i-th type true or sand permeability, and $k_{sh}^x$, $k_{sh}^y$, and $k_{sh}^z$ represent the x-, y-, and z-axis direction permeabilities of the pure shale formation, respectively, and a BA can be caused by fractures 400. According to the multi-component permeability model, the following equations can be used for determination of true reservoir permeability in a laminar formation, such as sand-shale formations:

For the x-axis and y-axis direction permeabilities which are in a direction parallel (e.g., horizontal) to the bedding plane, the x- and y-axis permeabilities can be represented using the following equations:

$$k_x = \Sigma_{i=1}^M (V_{sd}^{(i)} \cdot k_{sd}^{(i)}) + k_{sh}^x \cdot \Sigma_{i=1}^M V_{lam}^{(i)} = \Sigma_{i=1}^M (V_{sd}^{(i)} \cdot k_{sd}^{(i)}) + k_{sh}^x \cdot V_{lam} \quad (32)$$

$$k_y = \Sigma_{i=1}^M (V_{sd}^{(i)} \cdot k_{sd}^{(i)}) + k_{sh}^y \cdot \Sigma_{i=1}^M V_{lam}^{(i)} = \Sigma_{i=1}^M (V_{sd}^{(i)} \cdot k_{sd}^{(i)}) + k_{sh}^y \cdot V_{lam} \quad (33)$$

For z-axis direction permeability which is perpendicular (e.g., vertical) to the bedding plane, the z-axis permeability can be represented using the following equation:

$$\frac{1}{k_z} = \sum_{i=1}^{M}\left(\frac{V_{sd}^{(i)}}{k_{sd}^{(i)}}\right) + \frac{\sum_{i=1}^{M} V_{lam}^{(i)}}{k_{sh}^z} = \sum_{i=1}^{M}\left(\frac{V_{sd}^{(i)}}{k_{sd}^{(i)}}\right) + \frac{V_{lam}}{k_{sh}^z} \quad (34)$$

In equations (32), (33) and (34), it is assumed that all sands are isotropic and the shale is BA anisotropic. M represents the total number of the sand types. $k_{sh}^x$, $k_{sh}^y$, and $k_{sh}^z$ are the x-, y-, and z-axis direction permeabilities (or otherwise stated, two horizontal permeabilities and a vertical permeability) of the pure shale formation, respectively, $V_{lam} = \sum_{i=1}^{M} V_{lam}^{(i)}$ is the total laminated shale volume fraction, $V_{sd}^{(i)}$ is the volume percentage for the i-th type sand, $k_{sd}^{(i)}$ is the i-th type sand permeability, and $\sum_{i=1}^{M}(V_{sd}^{(i)}) + V_{lam} = 1$.

Figure 5:
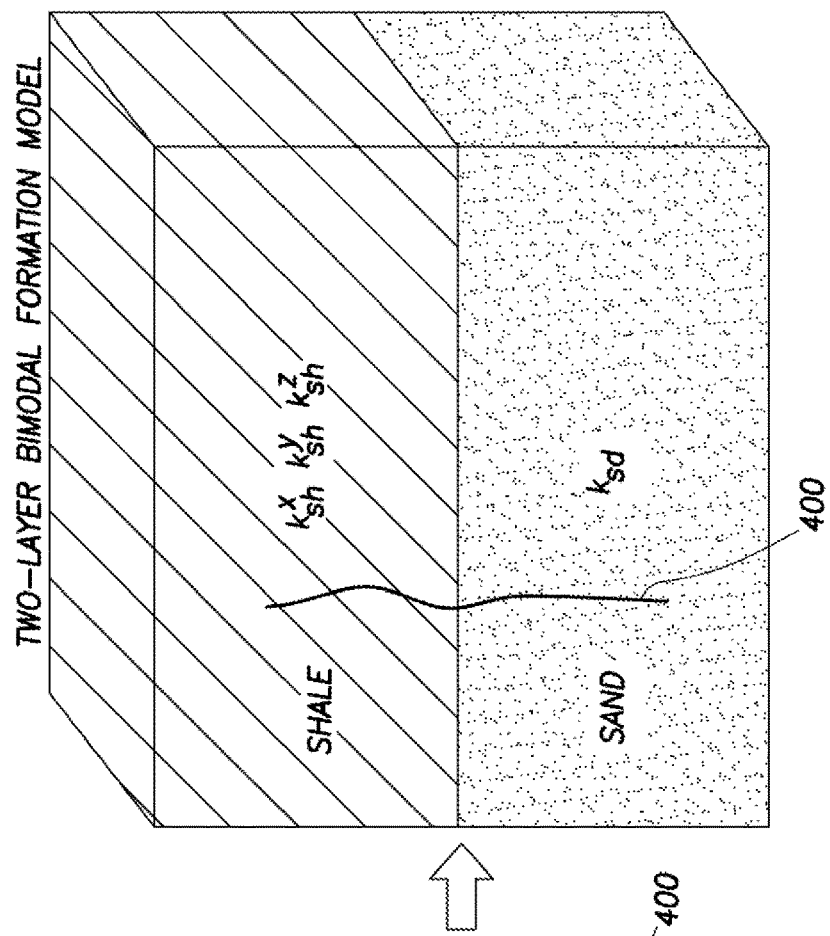
FIG. 5 is a diagram illustrating a bimodal permeability model consisting of isotropic sand and bi-axially isotropic shale, according to one or more example embodiments.
Figure 5:
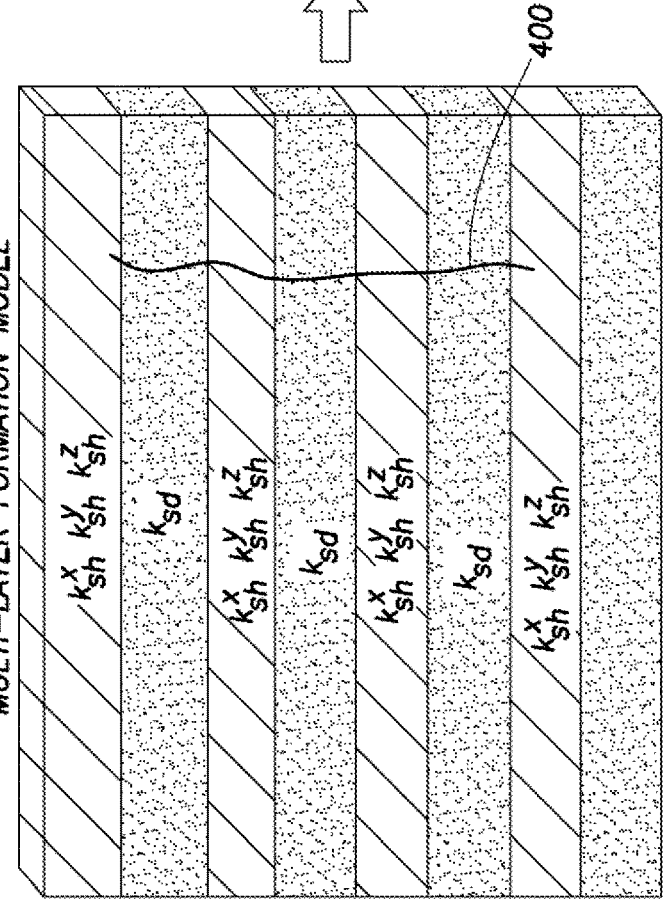

If it is assumed that M=1 or $k_{sd}^{(1)} = k_{sd}^{(2)} = \ldots = k_{sd}^{(M)} = k_{sd}$, the above equations can be reduced to a bimodal permeability model for determination of reservoir permeability. FIG. 5 is a diagram illustrating a bimodal permeability model consisting of isotropic sand and BA shale. Here, $k_{sd}$ is the true sand (or reservoir) permeability, and $k_{sh}^x$, $k_{sh}^y$, and $k_{sh}^z$ are the x-, y-, and z-axis direction permeabilities of the pure shale formation. As illustrated, a multi-layer model can be reduced to an equivalent two-layer bimodal model.

The x-directional permeability component can be represented using the following reduced equation:

$$k_x = (1 - V_{lam}) \cdot k_{sd} + V_{lam} \cdot k_{sh}^x \quad (35)$$

The y-directional permeability component can be represented using the following reduced equation:

$$k_y = (1 - V_{lam}) \cdot k_{sd} + V_{lam} \cdot k_{sh}^y \quad (36)$$

The z-directional permeability component can be represented using the following reduced equation:

$$\frac{1}{k_z} = \frac{(1 - V_{lam})}{k_{sd}} + \frac{V_{lam}}{k_{sh}^z}, \text{ or } k_z = \frac{1}{\frac{(1 - V_{lam})}{k_{sd}} + \frac{V_{lam}}{k_{sh}^z}} \quad (37)$$

Figure 6:
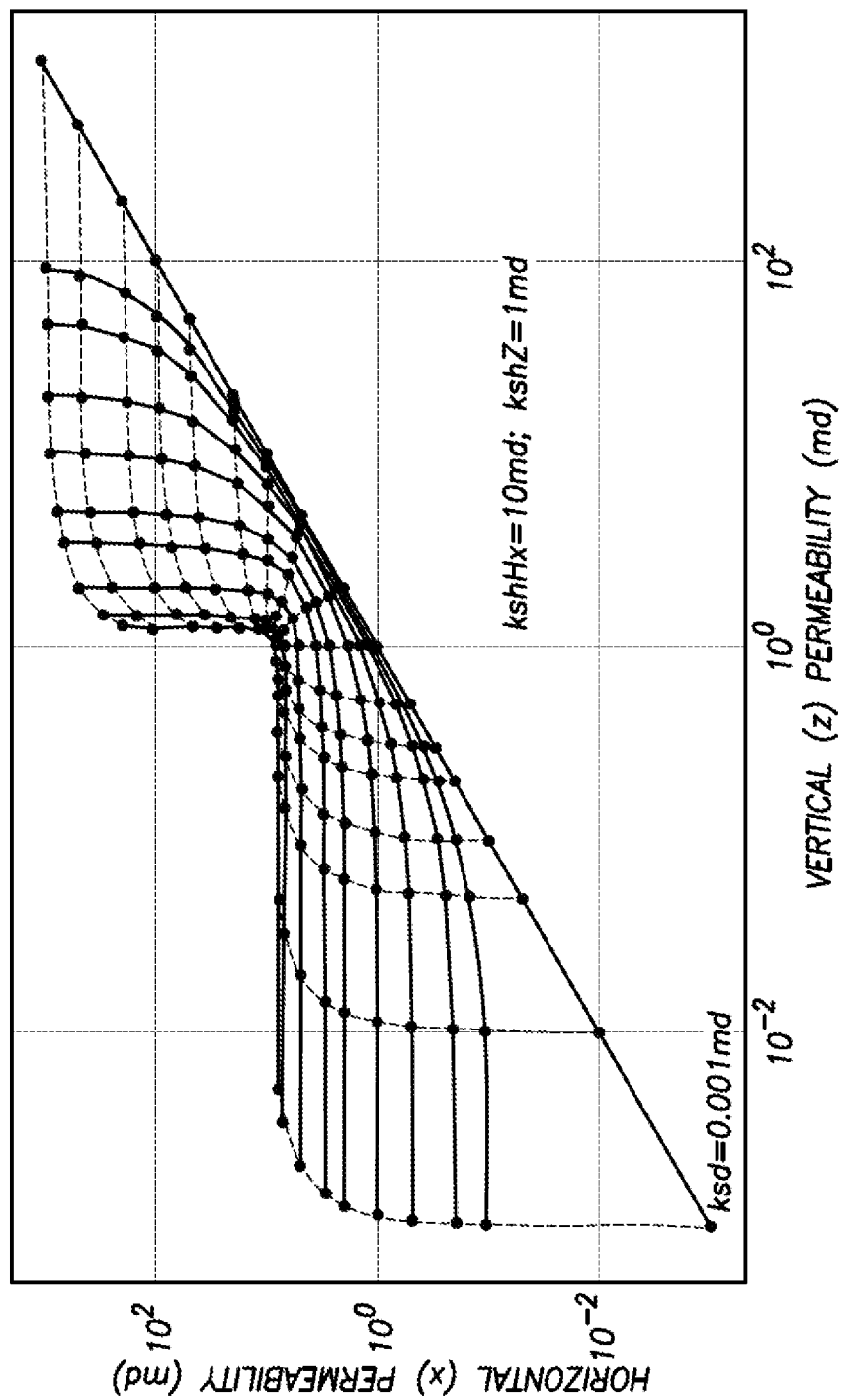
FIGS. 6 and 7 are plot diagrams of example graphical solutions for sand permeability $k_{sd}$ and laminar shale volume $V_{lam}$ in laminar formations, according to one or more example embodiments.
Figure 7:
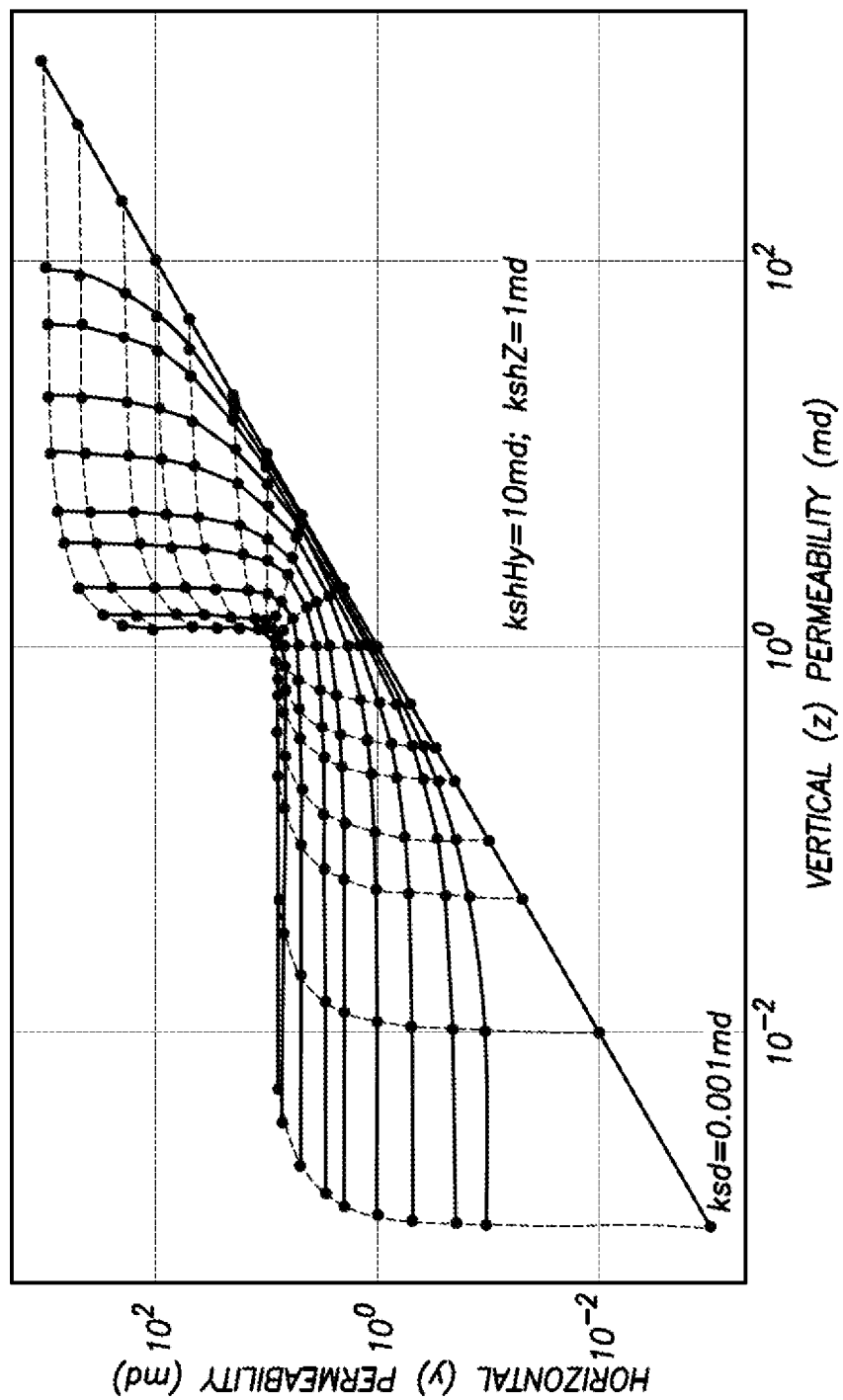

In equations (35), (36), and (37), if $k_x$, $k_y$, $k_z$ $k_{sh}^x$, $k_{sh}^y$, and $k_{sh}^z$ are known, such as from calculations and/or logged data, then the sand permeability $k_{sd}$ and $V_{lam}$ can be solved. For example, the graphical solution of sand permeability $k_{sd}$ and laminar shale volume $V_{lam}$ to equations (35), (36), and (37) for laminar shale at $k_{sh}^x$ (or kshHx)=10 md and $k_{sh}^z$ (or kshZ)=1 md are shown in FIG. 6. In FIG. 6, the dashed-line contours correspond to values of constant $V_{lam}$, and the solid-line contours represent values of constant $k_{sd}$. Similarly, FIG. 7 illustrates a graphical solution of sand permeability $k_{sd}$ and laminar shale volume $V_{lam}$ for laminar shale at $k_{sh}^y$ (or kshHy)=10 md and $k_{sh}^z$ (or kshZ)=1 md. In FIG. 7, the dashed-line contours correspond to values of constant $V_{lam}$, and the solid-line contours represent values of constant $k_{sd}$.

However, if it is assumed that both sand and shale are isotropic (e.g., $k_{sh}^x = k_{sh}^y = k_{sh}^z = k_{sh}$), equations (35), (36), and (37), can be expressed using the following equations:

$$k_x = (1 - V_{lam}) \cdot k_{sd} + V_{lam} \cdot k_{sh} \quad (38)$$

$$k_y = (1 - V_{lam}) \cdot k_{sd} + V_{lam} \cdot k_{sh} \quad (39)$$

$$\frac{1}{k_z} = \frac{(1 - V_{lam})}{k_{sd}} + \frac{V_{lam}}{k_{sh}}, \text{ or } k_z = \frac{1}{\frac{(1 - V_{lam})}{k_{sd}} + \frac{V_{lam}}{k_{sh}}} \quad (40)$$

Figure 9:
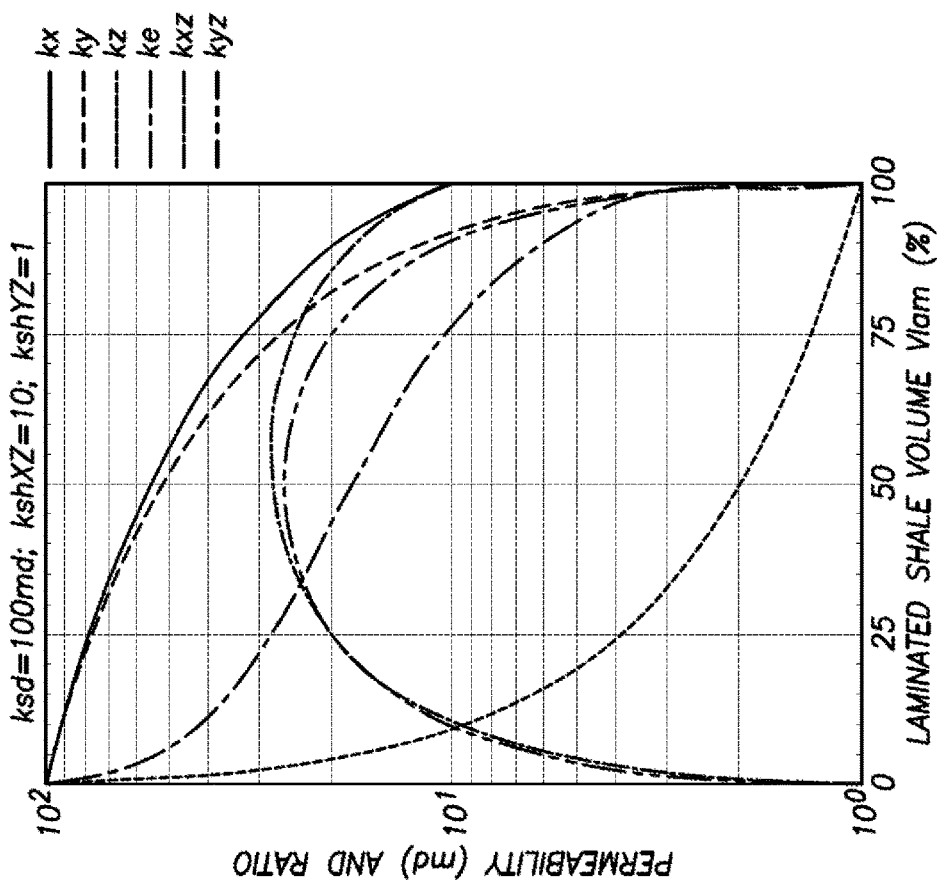
FIGS. 8 and 9 are plot diagrams that illustrate x-, y-, and z-axis direction permeability components, $k_x$, $k_y$ and $k_z$, effective permeability $k_e$, and anisotropic ratios $k_{xz}=k_x/k_z$ and $k_{yz}=k_y/k_z$ as a function of laminar shale volume $V_{lam}$, according to one or more example embodiments.
Figure 8:
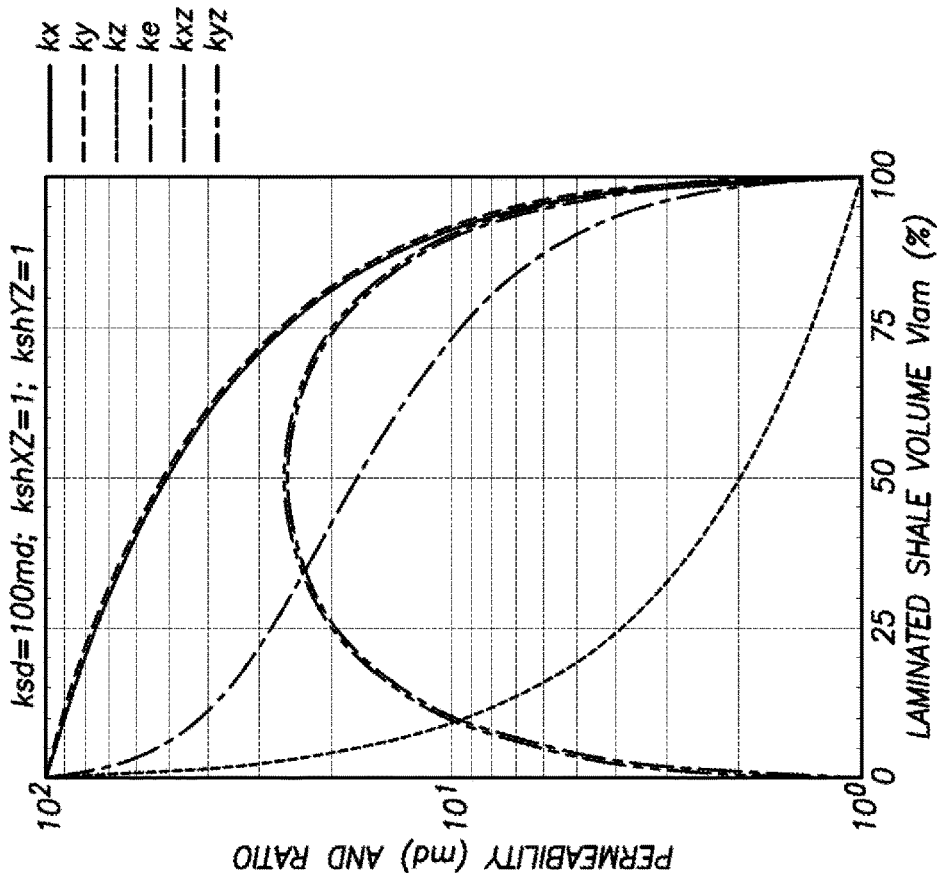

However, even though it is assumed that both the sand and shale are isotropic, the macro anisotropy of formation permeability can be observed. For example, FIGS. 8 and 9 show a pair of plots illustrating x-, y-, and z-axis direction permeability, $k_x$, $k_y$, and $k_z$, effective permeability $k_e$, and anisotropic ratios $k_{xz} = k_x/k_z$ and $k_{yz} = k_y/k_z$ as a function of laminar shale volume $V_{lam}$. If $V_{lam} \neq 0$, $k_{sd}$ and $k_{sh}$ represent the sandstone and shale permeability, respectively. If it is assumed that the tri-axial permeability components, $k_x$, $k_y$, $k_z$, and laminar shale volume $V_{lam}$ are known, then $k_{sd}$ and $k_{sh}$ can be resolved from equations (38), (39), and (40). After the lamination effects on the measured/calculated permeabilities, $k_x$, $k_y$, and $k_z$, are corrected, a more accurate permeability $k_{sd}$ for sand can be obtained. In FIG. 8, the sandstone permeability $k_{sd}$=100 md, and the shale permeabilities $k_{sh}^{xy}$ (or kshXZ)=$k_{sh}^{yz}$ (or kshYZ)=1 md, which indicates the shale is isotropic. In FIG. 9, the sandstone permeability $k_{sd}$=100 md, and the shale permeabilities $k_{sh}^{xz}$ (or kshXZ)=10 md and $k_{sh}^{yz}$ (or kshYZ)=1 md, which indicates the shale is BA. FIGS. 8 and 9 show that $k_{xz}$ and $k_{yz}$ approach a maximum value around 50% shale, that all curves are sensitive to the laminated shale volume, and that $k_y$, $k_z$, $k_{yz}$ are the same.

Using equations (38) and (40), the permeability anisotropy ratio $$k_{xz} = \frac{k_x}{k_z}$$

can be represented using the following equation:

$$\begin{aligned} k_{xz} = \frac{k_x}{k_z} &= [(1 - V_{lam}) \cdot k_{sd} + V_{lam} \cdot k_{sh}^x] * \left[\frac{(1 - V_{lam})}{k_{sd}} + \frac{V_{lam}}{k_{sh}^z}\right] \\ &= (1 - V_{lam})\left[(1 - V_{lam}) + V_{lam}\frac{k_{sd}}{k_{sh}^z}\right] + V_{lam}\left[(1 - V_{lam})\frac{k_{sh}^x}{k_{sd}} + V_{lam}k_{sh}^{xz}\right] \\ &= 1 - 2V_{lam} + V_{lam}(1 - V_{lam})\left[\frac{k_{sh}^x}{k_{sd}} + \frac{k_{sd}}{k_{sh}^z}\right] + V_{lam}V_{lam}[1 + k_{sh}^{xz}] \\ &= 1 + V_{lam}\left[(1 - V_{lam})\left[\frac{k_{sh}^x}{k_{sd}} + \frac{k_{sd}}{k_{sh}^z}\right] + V_{lam}[1 + k_{sh}^{xz}] - 2\right] \end{aligned} \quad (41)$$

or, $$k_{xz} - 1 = V_{lam}\left\{(1 - V_{lam})\left[\frac{k_{sh}^x}{k_{sd}} + \frac{k_{sd}}{k_{sh}^z}\right] + V_{lam}[1 + k_{sh}^{xz}] - 2\right\} \quad (42)$$

Using equations (39) and (40), the permeability anisotropy ratio $$k_{yz} = \frac{k_y}{k_z}$$

can be represented using the following equation:

$$\begin{aligned}k_{yz} = \frac{k_y}{k_z} &= [(1 - V_{lam}) \cdot k_{sd} + V_{lam} \cdot k_{sh}^y] * \left[\frac{(1 - V_{lam})}{k_{sd}} + \frac{V_{lam}}{k_{sh}^z}\right] \quad (43)\\ &= (1 - V_{lam})\left[(1 - V_{lam}) + V_{lam}\frac{k_{sd}}{k_{sh}^z}\right] + V_{lam}\left[(1 - V_{lam})\frac{k_{sh}^y}{k_{sd}} + V_{lam}k_{sh}^{yz}\right]\\ &= 1 + V_{lam}\left[(1 - V_{lam})\left[\frac{k_{sh}^y}{k_{sd}} + \frac{k_{sd}}{k_{sh}^z}\right] + V_{lam}[1 + k_{sh}^{yz}] - 2\right]\end{aligned}$$

or, $$k_{yz} - 1 = V_{lam}\left\{(1 - V_{lam})\left[\frac{k_{sh}^y}{k_{sd}} + \frac{k_{sd}}{k_{sh}^z}\right] + V_{lam}[1 + k_{sh}^{yz}] - 2\right\} \quad (44)$$

Further, the following equations can be used for calculating $R_x$, $R_y$, and $R_z$:

$$\frac{1}{R_x} = \frac{(1 - V_{lam})}{R_{sd}} + \frac{V_{lam}}{R_{sh}^x} \quad (45)$$

$$\frac{1}{R_y} = \frac{(1 - V_{lam})}{R_{sd}} + \frac{V_{lam}}{R_{sh}^y} \quad (46)$$

$$R_z = (1 - V_{lam}) \cdot R_{sd} + V_{lam} \cdot R_{sh}^z \quad (47)$$

The following equations can be used for calculating the resistivity anisotropy ratio $R_{zx}$:

$$\begin{aligned}R_{zx} = \frac{R_z}{R_x} &= \left[\frac{(1 - V_{lam})}{R_{sd}} + \frac{V_{lam}}{R_{sh}^x}\right][(1 - V_{lam}) \cdot R_{sd} + V_{lam} \cdot R_{sh}^z] \quad (48)\\ &= (1 - V_{lam})\left[(1 - V_{lam}) + V_{lam}\frac{R_{sh}^z}{R_{sd}}\right] + V_{lam}\left[(1 - V_{lam})\frac{R_{sd}}{R_{sh}^x} + V_{lam}R_{sh}^{zx}\right]\\ &= 1 - 2V_{lam} + V_{lam}V_{lam}(1 + R_{sh}^{zx}) + V_{lam}(1 - V_{lam})\left[\frac{R_{sh}^z}{R_{sd}} + \frac{R_{sd}}{R_{sh}^x}\right]\end{aligned}$$

or, $$R_{zx} - 1 = V_{lam}\left\{(1 - V_{lam})\left[\frac{R_{sh}^z}{R_{sd}} + \frac{R_{sd}}{R_{sh}^x}\right] + V_{lam}(1 + R_{sh}^{zx}) - 2\right\} \quad (49)$$

From the above, it can be observed that: if $$\frac{k_{sd}}{k_{sh}^z} = \frac{R_{sh}^z}{R_{sd}}, \frac{k_{sh}^x}{k_{sd}} = \frac{R_{sd}}{R_{sh}^x},$$

and $k_{sh}^{xz} = R_{sh}^{zx}$, then $k_{xz} = R_{zx}$ (or $C_{RP}^{xz} = 1$). Otherwise, $C_{RP}^{xz} = k_{xz}/R_{zx}$, or $C_{RP}^{xz} = (k_{xz}-1)/(R_{zx}-1)$, and $C_{RP}^{xz}$ is a non-linear function of $V_{lam}$, $$\frac{k_{sd}}{k_{sh}^z}, \frac{k_{sh}^x}{k_{sd}},$$

$k_{sh}^{xz}$, and $$\frac{R_{sh}^z}{R_{sd}}, \frac{R_{sd}}{R_{sh}^x},$$

$R_{sh}^{zx}$, and can be represented using the following equation:

$$C_{RP}^{xz} = \frac{\left\{(1-V_{lam})\left[\frac{k_{sh}^x}{k_{sd}} + \frac{k_{sd}}{k_{sh}^z}\right] + V_{lam}[1+K_{sh}^{xz}] - 2\right\}}{\left\{(1-V_{lam})\left[\frac{R_{sh}^z}{R_{sd}} + \frac{R_{sd}}{R_{sh}^x}\right] + V_{lam}(1+R_{sh}^{zx}) - 2\right\}} \quad (50)$$

Similarly, $C_{RP}^{yz}$ is a non-linear function of $V_{lam}$, $$\frac{k_{sd}}{k_{sh}^z}, \frac{k_{sh}^y}{k_{sd}}, k_{sh}^{yz}, \text{ and } \frac{R_{sh}^z}{R_{sd}}, \frac{R_{sd}}{R_{sh}^y}, R_{sh}^{zy},$$

and can be represented using the following equation:

$$C_{RP}^{yz} = \frac{\left\{(1-V_{lam})\left[\frac{k_{sh}^y}{k_{sd}} + \frac{k_{sd}}{k_{sh}^z}\right] + V_{lam}[1+K_{sh}^{yz}] - 2\right\}}{\left\{(1-V_{lam})\left[\frac{R_{sh}^z}{R_{sd}} + \frac{R_{sd}}{R_{sh}^y}\right] + V_{lam}(1+R_{sh}^{zy}) - 2\right\}} \quad (51)$$

Once all of $V_{lam}$, $$\frac{k_{sd}}{k_{sh}^z}, \frac{k_{sh}^x}{k_{sd}},$$

and k-hd $sh^{xz}$, and $$\frac{R_{sh}^z}{R_{sd}}, \frac{R_{sd}}{R_{sh}^x},$$

$R_{sh}^{zx}$ are known, equation (50) can be used to estimate $C_{RP}^{xz}$. Once all of $V_{lam}$, $$\frac{k_{sd}}{k_{sh}^z}, \frac{k_{sh}^y}{k_{sd}},$$

$k_{sh}^{yz}$, and $$\frac{R_{sh}^z}{R_{sd}}, \frac{R_{sd}}{R_{sh}^y},$$

$R_{sh}^{zx}$ are known, equation (51) can be used to estimate $C_{RP}^{xz}$. Also, the relationships given by the following equations should also be understood, where: $k_{xz} = R_{zx}$, $k_{yz} = R_{zy}$, and $k_{xy} = R_{yx}$.

Figure 10:
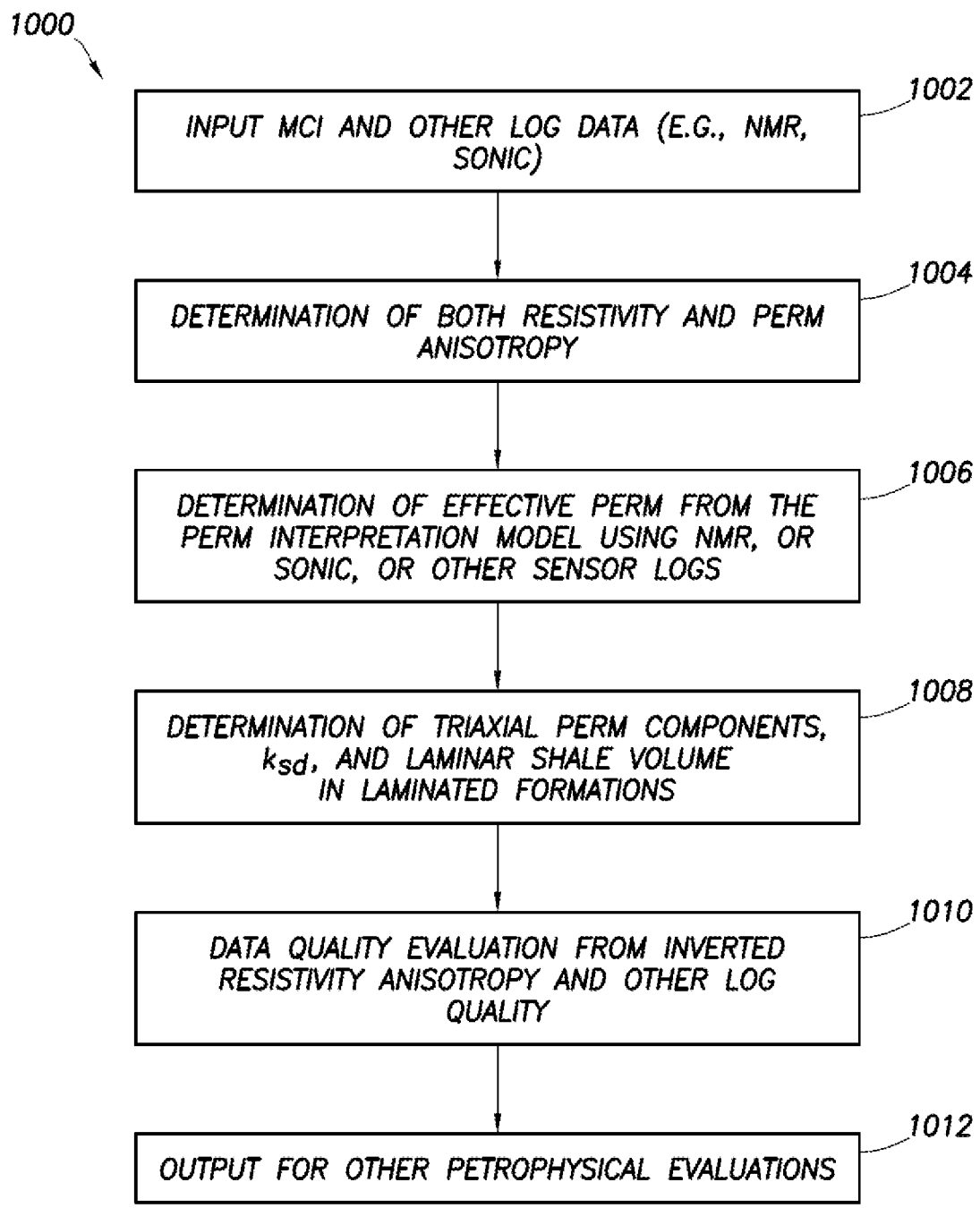
FIG. 10 is flow chart illustrating a method for evaluation of formation permeability anisotropy, according to one or more example embodiments.

FIG. 10 is a flow chart illustrating a method 1000 comprising multi-level data processing based on forward models with BA anisotropies. The method 1000 provides for evaluation of formation permeability anisotropy using an integration of MCI log data with other conventional/advanced sensor logs (e.g., conventional such as triple combo logs, or advanced such as sonic, NMR, RDT, or other conventional/advanced sensors 127).

At operation 1002, MCI measurement data captured by a tri-axial MCI tool in a borehole extending through a subsurface geological formation can be inputted after calibration, temperature correction and other preprocessing. This preprocessing may not include skin-effect correction. The MCI data may be multi-frequency data, and may be taken at multiple spacings. In some embodiments, the MCI measurement data can be single-frequency measurements for the respective arrays of the tool. Further, other log data captured by, for example, sonic or NMR sensors 127 can also be inputted.

At operation 1004, inversion processing is applied to MCI measurement data to produce inverted parameters to be used for permeability evaluation. For example, a BA-based inversion can be applied to produce the inverted BA parameters of $R_x$, $R_y$, and $R_z$. The BA-based inversion processing can be based on various formation models, including, but not limited to: radially one-dimensional (R1D) and zero-dimensional (0D) models. The inverted parameters can be used for the determination of, for example, the resistivity anisotropy ratios ($R_{xz}$, $R_{yz}$, $R_{xy}$). The permeability anisotropy ratios ($k_{xz}$, $k_{yz}$, $k_{xy}$) can be determined from the resistivity anisotropy using, for example, equations (13) (19) as discussed above.

At operation 1006, the effective permeability $k_e$ (or a permeability component) can be determined using conventional log data-derived permeabilities (e.g., using NMR, RDT, sonic, and/or resistivity logs). At operation 1008, permeability components can be determined using resistivity anisotropy data obtained from MCI measurement data and the effective permeability $k_e$ from conventional permeability logs. In one embodiment, the tri-axial resistivity components ($R_x$, $R_y$, and $R_z$) and the effective permeability (or a permeability component), can be used to determine the tri-axial permeability components ($k_x$, $k_y$, and $k_z$) and permeability anisotropy $$\left(\text{e.g., } \frac{k_x}{k_y}, \text{ and } \frac{k_y}{k_z}\right)$$

using equations (29)-(31) as discussed above. The permeability components can be used to solve equations (32)-(34) as discussed above for recovering the permeabilities constants $k_{sh}^x$, $k_{sh}^y$, and $k_{sh}^z$ of a pure shale formation. Equations (32)-(34) can also be used to determine the laminar shale volume $V_{lam}$. With a known laminar shale volume $V_{lam}$, equations (35), (36) and (37) as discussed above can be solved to obtain the sand permeability $k_{sd}$ in laminated formations.

Once the above data is determined, equations (50) and (51) as discussed above can be used to estimate the $C_{RP}^{xz}$ and $C_{RP}^{yz}$ coefficients. In some embodiments, the calculated $k_x$, $k_y$, and $k_z$, and $k_{sd}$ (as well as $k_{sh}$) can be evaluated for data quality at operation 1010 before output for use in formation evaluation at 1012.

Benefits of the described methods and systems for permeability anisotropy assessment using both MCI data and conventional permeability logs include more accurate reservoir assessment, fracture detection, and oil development/production.

FIGS. 11-14 are plots that provide a synthetic data set for predicting the permeability anisotropy ratios and the permeability components ($k_x$, $k_y$, and $k_z$) from an integrated interpretation of $V_{lam}$, $R_x$, $R_y$, $R_z$, and the effective permeability ($k_e$).

Figure 11:
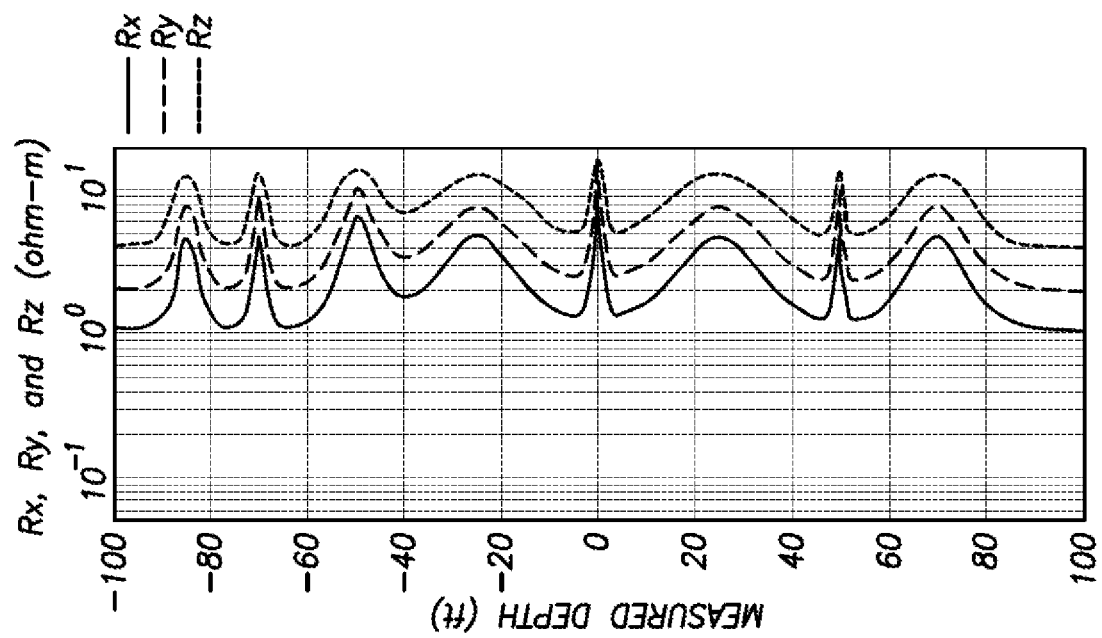

FIG. 11 illustrates simulated x-, y-, and z-axis direction resistivities ($R_x$, $R_y$, $R_z$) having units of ohm-m over a range of depths. The resistivities $R_x$, $R_y$, and $R_z$ can be calculated using equations (45), (46), and (47), as discussed above, for a given $R_{sd}$ and $R_{sh}^x=1$ (or $R_{sh}^{zx}=4$), $R_{sh}^y=2$ (or $R_{sh}^{zy}=2$), $R_{sh}^z=4$ ohm-m plus the known $V_{lam}$ as given in the FIG. 12. The laminar shale volume log $V_{lam}$ can be simulated using the below equation:

$$V_{lam}(z, AA, BB) = AA - BB \cdot \Sigma_{i=1}^{N_{sh}} a_i \cdot g_i(z, b_i, c_i) \quad (52)$$

where z represents the logging depth (in units of feet), AA=0.95, BB=0.85, and $N_{sh}$=7, and $g_i(z, b_i, c_i)$ represents multiple, modified Gaussian functions, which can be expressed using the below equation:

$$g_i(z, b_i, c_i) = e^{-\frac{1}{2}\left(\frac{z-b_i}{c_i}\right)^2}, \quad i = 1, 2, \ldots, N_{sh} \quad (53)$$

where $a_i$=1, $b_i$=−70, −50, −25, 0, 25, 50, 70, and $c_i$=5, 5, 10, 5, 10, 5, 5.

Figure 12:
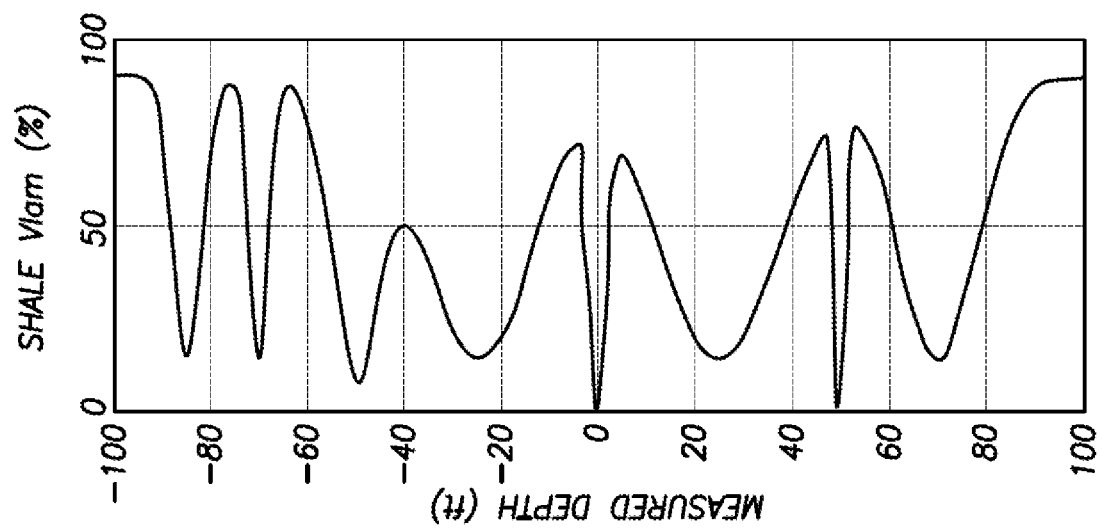
FIG. 11-14 are a set of plots that provide a synthetic data set without errors for predicting the permeability of the sand ($k_s$), equivalent permeability of the earthen formation ($k_e$) and the x-, y-, and z-axis direction permeability components ($k_x$, $k_y$, and $k_z$), according to one or more example embodiments.
Figure 14:
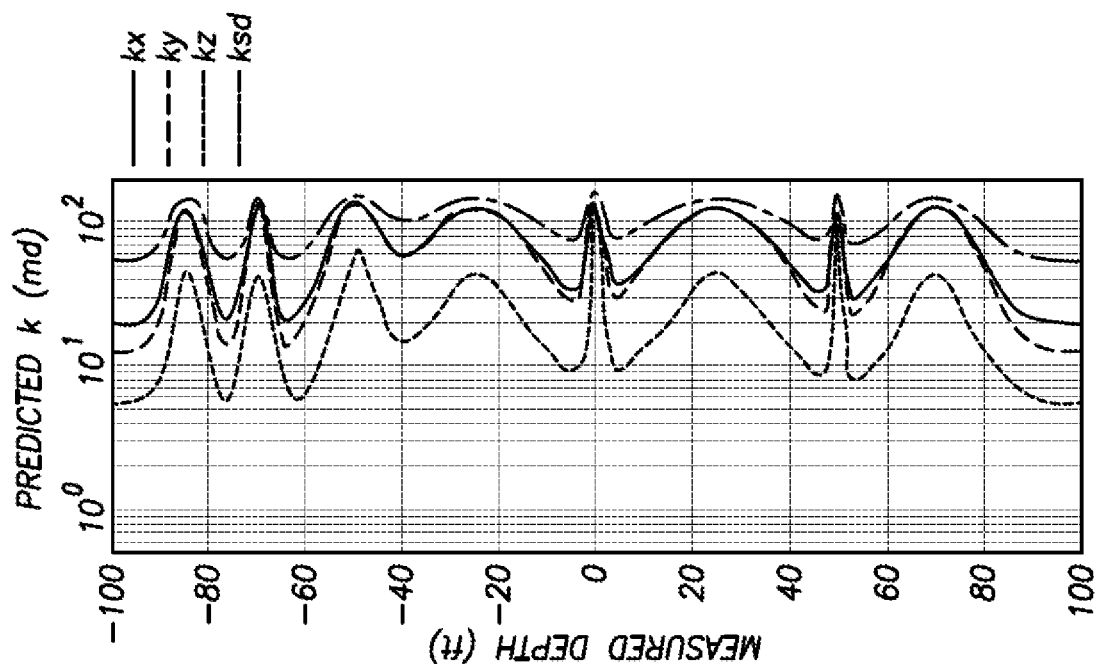
Figure 13:
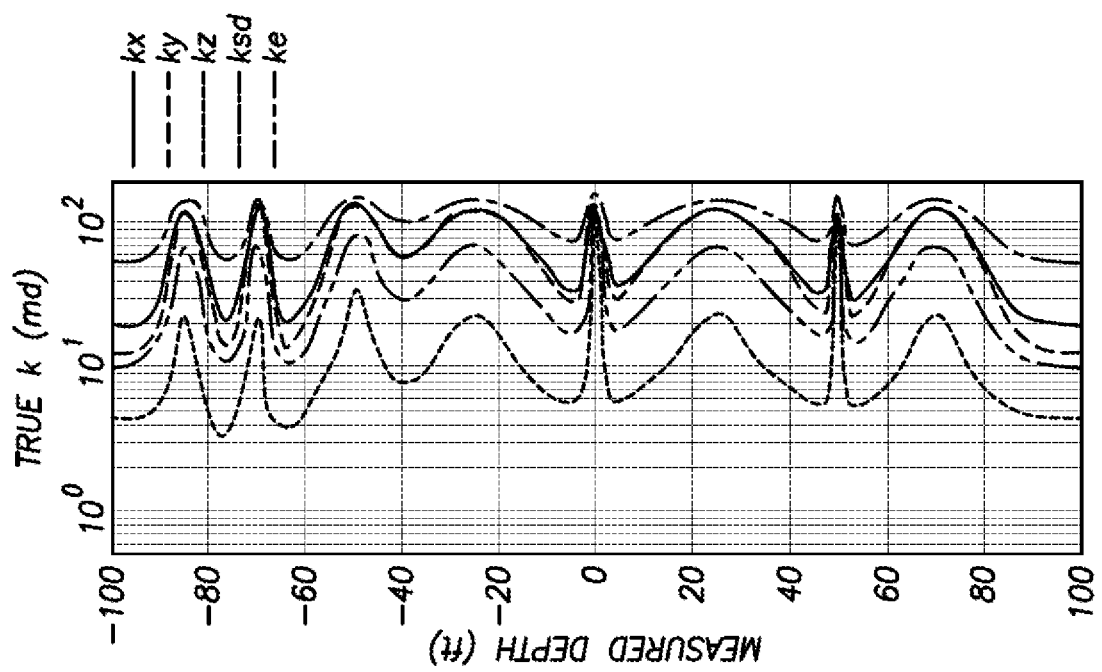

FIG. 13 illustrates simulated x-, y-, and z-axis direction permeabilities ($k_x$, $k_y$, and $k_z$), effective permeability ($k_e$), where the permeabilities ($k_x$, $k_y$, $k_z$, and $k_e$) can be determined by equations (38), (39), (40), and (30) with a given $k_{sd}$, and $k_{sh}^x$=16, $k_{sh}^y$=8, $k_{sh}^z$=4, and further with the known $V_{lam}$ from FIG. 12. FIG. 14 illustrates the predicted permeabilities ($k_x$, $k_y$, and $k_z$), and sand permeability ($k_{sd}$), using the workflow described in FIG. 10.

Due to the permeability macro-anisotropy caused by laminations and the limitation of tool vertical resolution, the effective permeability $k_e$ from conventional logs is not the same as permeabilities $k_x$, $k_y$, and $k_z$. Further, it can be seen that all of the permeabilities $k_e$, $k_x$, $k_y$, and $k_z$ are significantly different from the $k_{sd}$ log for the same lamination reason. However, by comparing FIGS. 13 and 14, it can be seen that the predicted $k_x$, $k_y$, $k_z$, and $k_{sd}$ in FIG. 14 are substantially the same as their true values in FIG. 13.

Figure 15:
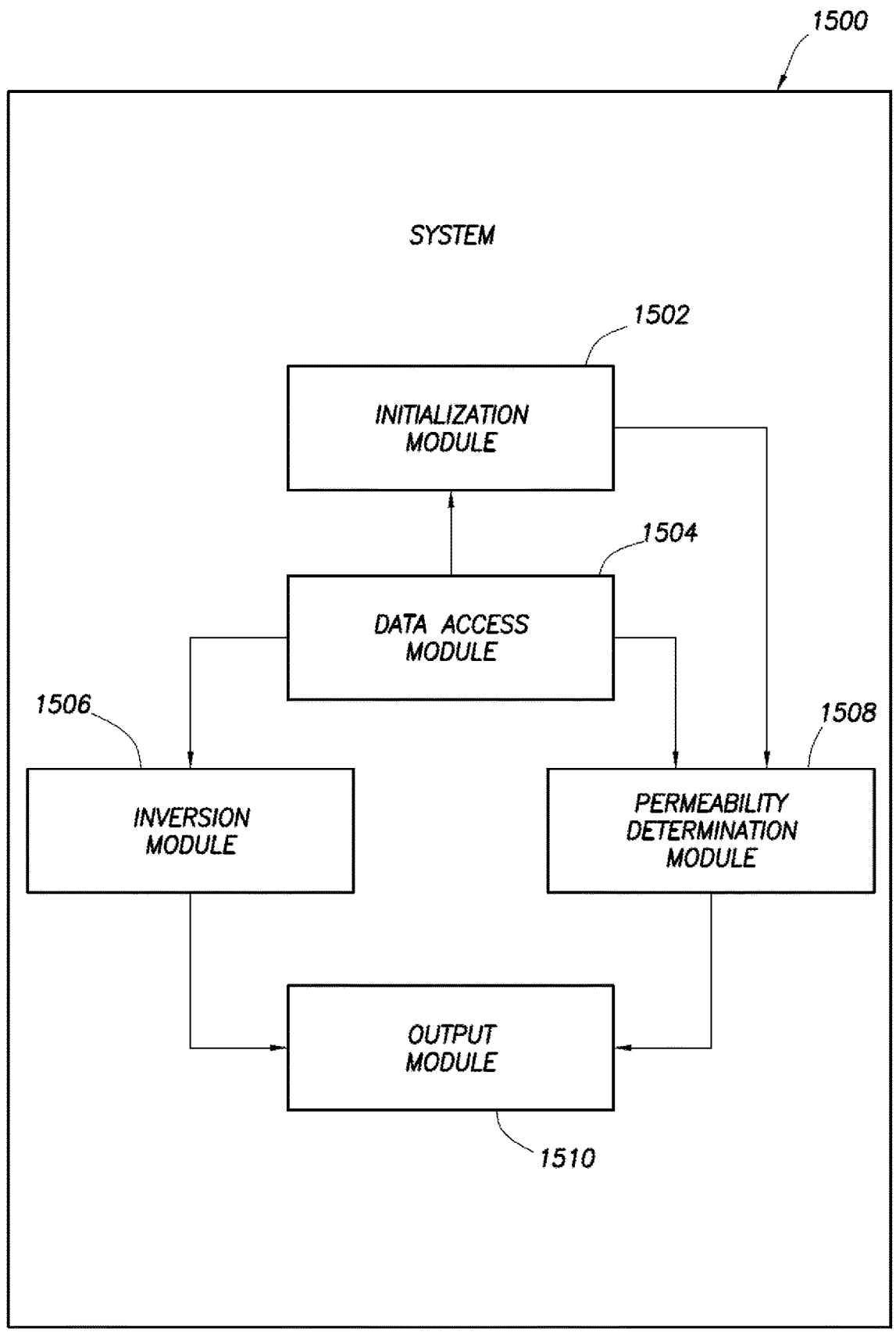
FIG. 15 is a schematic block diagram of a system for permeability determination, according to one or more example embodiments.

FIG. 15 is a schematic block diagram of an example system 1500 for estimating subsurface formation and invasion properties, according to an example embodiment. The example system 1500 of FIG. 15 may be configured to perform one or more of the methods described above with reference to FIG. 10. The system 1500 is described in terms of a number of modules for performing the respective operations previously described. As used herein a "module" can be an engine, logic component, or mechanism capable of performing described operations and/or configured or arranged in a certain manner. Modules may constitute either software modules, with code embodied on a non-transitory machine-readable medium (i.e., such as any conventional storage device, such as volatile or non-volatile memory, disk drives or solid state storage devices (SSDs), etc.), or hardware-implemented modules. In certain example embodiments, one or more computer systems (e.g., a standalone, client, or server computer system) or one or more components of a computer system (e.g., a processor or a group of processors) may be configured by software (e.g., an application or application portion) or firmware (note that software and firmware can generally be used interchangeably herein as is known by a skilled artisan) as a module that operates to perform the described operations.

In various embodiments, a hardware-implemented module may be implemented mechanically or electronically. A hardware-implemented module is a tangible unit capable of performing certain operations and may be configured or arranged in a certain manner. In example embodiments, one or more computer systems (e.g., a standalone, client, or server computer system) or one or more processors may be configured by software (e.g., an application or application portion) as a hardware-implemented module that operates to perform certain operations as described herein. For example, a hardware-implemented module may include dedicated circuitry or logic that is permanently configured (e.g., within a special-purpose processor, application specific integrated circuit (ASIC), or logic array) to perform the identified operations. A hardware-implemented module may also include programmable logic or circuitry (e.g., as encompassed within a general-purpose processor or other programmable processor) that is temporarily configured by software or firmware to perform some or all of such operations.

The term "hardware-implemented module" should be understood to encompass a tangible entity, be that an entity that is physically constructed, permanently configured (e.g., hardwired), or temporarily or transitorily configured (e.g., programmed) to operate in a certain manner and/or to perform certain operations described herein. Considering embodiments in which hardware-implemented modules are temporarily configured (e.g., programmed), each of the hardware-implemented modules need not be configured or instantiated at any one instance in time. For example, where the hardware-implemented modules comprise a general-purpose processor configured using software, the general-purpose processor may be configured as respective different hardware-implemented modules at different times. Software may accordingly configure a processor, for example, to constitute a particular hardware-implemented module at one instance of time and to constitute a different hardware-implemented module at a different instance of time.

Hardware-implemented modules can provide information to, and receive information from, other hardware-implemented modules. Accordingly, the described hardware-implemented modules may be regarded as being communicatively coupled. Where multiple of such hardware-implemented modules exist contemporaneously, communications may be achieved through signal transmission (e.g., over appropriate circuits and buses) that connect the hardware-implemented modules. In embodiments in which multiple hardware-implemented modules are configured or instantiated at different times, communications between such hardware-implemented modules may be achieved, for example, through the storage and retrieval of information in memory structures to which the multiple hardware-implemented modules have access. For example, one hardware-implemented module may perform an operation and store the output of that operation in a memory device to which it is communicatively coupled. A further hardware-implemented module may then, at a later time, access the memory device to retrieve and process the stored output. Hardware-implemented modules may also initiate communications with input or output devices, and can operate on a resource (e.g., a collection of information).

Accordingly, the term "module" should be understood to encompass a tangible entity, be that an entity that is physically constructed, permanently configured (e.g., hardwired), non-transitory, or temporarily configured (e.g., programmed) to operate in a certain manner or to perform certain operations described herein. In some embodiments, modules or components may temporarily configured (e.g., programmed); and each of the modules or components need not be configured or instantiated at any one instance in time. For example, where the modules or components include a general-purpose processor configured using software, the general-purpose processor may be configured as respective different modules at different times. Software may accordingly configure the processor to constitute a particular module at one instance of time and to constitute a different module at a different instance of time.

Modules can provide information to, and receive information from, other modules. Accordingly, the described modules may be regarded as being communicatively coupled. Where multiples of such modules exist contemporaneously, communications may be achieved through signal transmission (e.g., over appropriate circuits and buses) that connect the modules. In embodiments in which multiple modules are configured or instantiated at different times, communications between such modules may be achieved, for example, through the storage and retrieval of information in memory structures to which the multiple modules have access. For example, one module may perform an operation and store the output of that operation in a memory device to which it is communicatively coupled. A further module may then, at a later time, access the memory device to retrieve and process the stored output. Modules may also initiate communications with input or output devices and can operate on a resource (e.g., a collection of information).

For purposes of the present description, the modules of FIG. 15 will be described in terms of the algorithms executed in each module, as may be executed by one or more processors, general purpose computer or other mechanism based on instructions stored in hardware in accordance with the description above.

In this example embodiment, the system 1500 includes a data access module 1504 configured to access MCI and other logging data from an initialization module 1502. An inversion module 1506 is configured to perform inversion in accordance with one or more of the example embodiments discussed with reference to FIG. 10, while a permeability determination module 1508 is configured to determine 3D permeability anisotropy components based on results of the inversion, according to the permeability anisotropy models and/or formulas discussed above. In one embodiment, the inversion module 1506 can be configured to calculate inverted BA parameters by performing an iterative inversion operation on the MCI data using a BA formation model that represents simulated formation resistivity characteristics that account for bi-axial formation anisotropy to resistivity as discussed above regarding FIG. 10.

After inversion processing, the permeability determination module 1508 can perform permeability anisotropy calculations. The system 1500 can further comprise an output module 1510 configured to deliver the calculated permeability components. The output module 1510 may in some embodiments deliver numerical tables with estimated values for formation resistivity, laminar shale volume, and/or various permeability components and invasion resistivity at multiple different points along a borehole. In other embodiments, a graphical plot that maps the estimated values to the borehole positions may be printed in hard copy, and/or may be displayed on a display screen (e.g., video display unit 1610 as further described below in reference to FIG. 16).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., Application Program Interfaces (APIs).)

Figure 16:
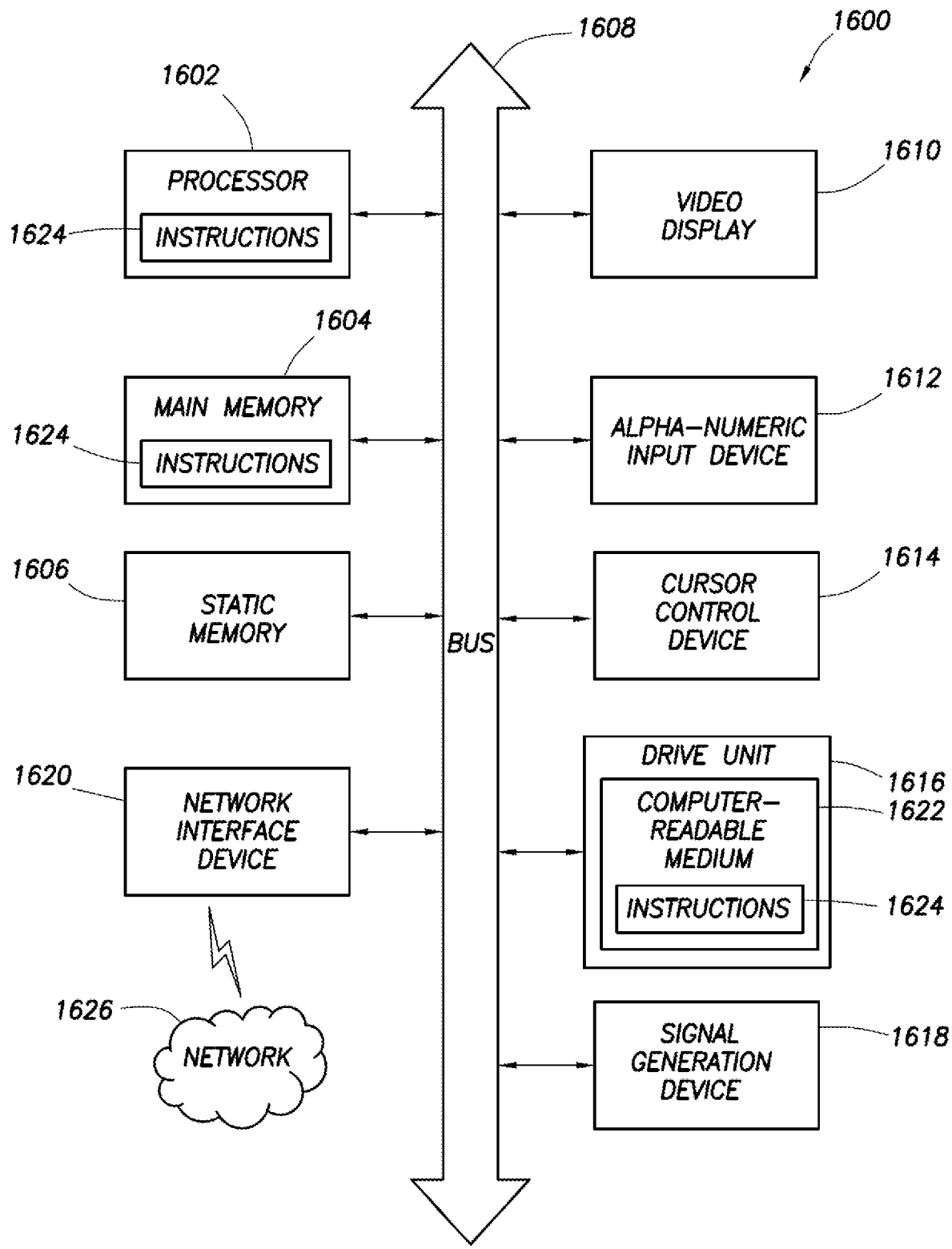
FIG. 16 is a diagrammatic representation of a machine in the example form of a computer system within which a set of instructions for causing the machine to perform a method for permeability determination may be executed, according to one or more example embodiments.

FIG. 16 is a diagrammatic representation of a machine in the example form of a computer system 1600 within which a set of instructions 1624 may be executed for causing the machine to perform any one or more of the methodologies discussed herein. For example, the surface computer system 366 (FIG. 3) or any one or more of its components may be provided by the system 1600.

In alternative embodiments, the machine operates as a standalone device or may be connected (e.g., networked) to other machines. In a networked deployment, the machine may operate in the capacity of a server or a client machine in a server-client network environment, or as a peer machine in a peer-to-peer (or distributed) network environment. The machine may be a server computer, a client computer, a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 1600 includes a processor 1602 (e.g., a central processing unit (CPU) a graphics processing unit (GPU) or both), a main memory 1604 and a static memory 1606, which communicate with each other via a bus 1608. The computer system 1600 may further include a video display unit 1610 (e.g., a liquid crystal display (LCD), a cathode ray tube (CRT), etc.). The computer system 1600 also includes an alpha-numeric input device 1612 (e.g., a keyboard), a cursor control device 1614 (e.g., a mouse, trackball, etc.), a disk drive unit 1616, a signal generation device 1618 (e.g., a microphone/speaker) and a network interface device 1620.

The disk drive unit 1616 includes a machine-readable or computer-readable storage medium 1622 on which is stored one or more sets of instructions 1624 (e.g., software) embodying any one or more of the methodologies or functions described herein. The instructions 1624 may also reside, completely or at least partially, within the main memory 1604 and/or within the processor 1602 during execution thereof by the computer system 1600, the main memory 1604 and the processor 1602 also constituting non-transitory machine-readable media. The instructions 1624 may further be transmitted or received over a network 1626 via the network interface device 1620.

While the machine-readable storage medium 1622 is shown in an example embodiment to be a single medium, the term "machine-readable medium" should be taken to include a single medium or multiple media (e.g., a centralized or distributed database and/or associated caches and servers) that store the one or more sets of instructions 1624. The term "machine-readable medium" shall also be taken to include any medium that is capable of storing a set of instructions for execution by the machine and that cause the machine to perform any one or more of the methodologies of this disclosure. The term "machine-readable medium" shall accordingly be taken to include, but not be limited to, solid-state memory devices of all types, as well as optical and magnetic media.

Although this disclosure has been described with reference to specific example embodiments, it will be evident that various modifications and changes may be made to these embodiments without departing from the broader scope of the disclosure. Accordingly, the specification and drawings are to be regarded in an illustrative rather than a restrictive sense.

Thus, a method for determining permeability of an earthen formation 118 penetrated by a borehole 116 has been described. Embodiments of the method may generally include positioning a sensor 127 in the borehole 116, measuring characteristics of the earthen formation 118 using the sensor 127, logging the characteristics, and determining an effective permeability based on the logged characteristics. Positioning a logging tool 126, 234, 365 in the borehole 116, measuring three dimensional (3D) data using the logging tool 126, 234, 365 determining 3D resistivity components $R_x$, $R_y$, and $R_z$ of the earthen formation 118 by inverting the 3D data, logging the 3D resistivity components $R_x$, $R_y$, and $R_z$, and determining tri-axial permeability components $k_x$, $k_y$, $k_z$ based on the effective permeability and the 3D resistivity component logs. Determining a permeability of sand $k_{sd}$ in the earthen formation 118, based at least in part on the tri-axial permeability components $k_x$, $k_y$, $k_z$, the effective permeability $k_e$, and a laminated shale volume $V_{lam}$. Logging the sand permeability and initiating a modification to an operation (or operations) based on the sand permeability.

Other embodiments of the method may generally include determining permeability of sand $k_{sd}$ in a laminated shale formation, drilling a borehole 116 through an earthen formation with the laminated shale formation 118, measuring parameters of the laminated shale formation 118 with a sensor 127 positioned in the borehole 116 and logging the parameters, determining an effective permeability $k_e$ based on the logged parameters, measuring three dimensional (3D) induction data of the laminated shale formation 118 with a multicomponent induction (MCI) logging tool 126, 234, 365, and calculating 3D resistivity components from the 3D induction data. Determining tri-axial permeability components $k_x$, $k_y$, $k_z$ based on the effective permeability $k_e$ and a percentage of shale $V_{lam}$, that is present in a volume of the laminated shale formation 118. Determining the sand permeability $k_{sd}$ based at least in part on the tri-axial permeability components $k_x$, $k_y$, $k_z$, the effective permeability $k_e$, and the percentage of shale $V_{lam}$, logging the sand permeability $k_{sd}$, and initiating a modification to a borehole operation based on the sand permeability $k_{sd}$.

For the foregoing embodiments, the method may include any one of the following steps, alone or in combination with each other:

The method can also include initiating a modification to at least one of a borehole drilling operation, a borehole production operation, a borehole injection operation, and a borehole logging operation in response to the sand permeability $k_{sd}$ logs. It should be understood that "modifying a borehole operation" refers to altering performance of any activities that may occur during, for example, borehole drilling, production, injection, and/or logging operations. Examples of modifications to a borehole drilling operation can be to change direction of a drill bit, increase/decrease RPM of the drill bit, increase/decrease advancement speed of the drill bit, change mud characteristics, etc. Examples of modifications to a borehole production operation can be changes to well screen sizes and positions in a tubing string, changes to cement parameters, changes to fluid flow related systems based on anticipated flow rates, etc. Examples of modifications to injection operations can be decisions made regarding a type of injection fluid to be used and possible flow rates for injecting the fluid. Examples of modifications to a logging operation can be to perform more or fewer processes for logging parameters of the borehole.

Determining of the tri-axial permeability components $k_x$, $k_y$, $k_z$ may also include performing an iterative inversion operation on the 3D induction data. The logging tool 126, 234, 356 can include a multicomponent induction (MCI) measurement device that measures the 3D induction data. The effective permeability $k_e$ can represent an isotropic permeability of a laminated region in the earthen formation 118, and the isotropic permeability $k_e$ can be measured by the sensor 127. Determining the tri-axial permeability components $k_x$, $k_y$, $k_z$ can further include calculating one of the tri-axial permeability components $k_x$, $k_y$, $k_z$ for each one of the x-axis, y-axis, and z-axis directions in a shale formation. The determining the tri-axial permeability components $k_x$, $k_y$, $k_z$ can further include calculating ratios $k_x/k_y$, $k_x/k_z$, and $k_y/k_z$ between pairs of the tri-axial permeability components $k_x$, $k_y$, $k_z$. Generating a visualization of the one or more tri-axial permeability components $k_x$, $k_y$, $k_z$ for display on a display device 1610. Generating a visualization of the sand permeability $k_{sd}$ for display on the display device 1610. The sensor 127 can be selected from a group consisting of a nuclear magnetic resonance (NMR) sensor, multi-pole sonic logging (MSL) sensor, and a resistivity sensor. Initiating a modification to at least one of a drilling operation, a production operation, an injection operation, and a logging operation in response to displaying the sand permeability $k_{sd}$ and/or the tri-axial permeability components $k_x$, $k_y$, $k_z$.

Additionally, a system for determining permeability of an earthen formation 118 penetrated by a borehole 116 has been described. Embodiments of the system may generally include a data access module to access multicomponent induction (MCI) three dimensional (3D) data captured by a logging tool 126, 234, 356 and isotropic permeability $k_e$ data captured by a sensor 127 in the borehole 116. An inversion module 1506 can calculate inverted 3D resistivity parameters $R_x$, $R_y$, and $R_z$ by performing an iterative inversion operation of the MCI data, a permeability determination module 1508 that can calculate tri-axial permeability components $k_x,k_y,k_z$ based at least in part on the isotropic permeability $k_e$ data and the inverted 3D resistivity parameters $R_x$, $R_y$, and $R_z$. A display device 1610 can generate a visualization of the tri-axial permeability components $k_x,k_y,k_z$ for display to an operator or for logging. The logged or displayed data can be used to modify current and/or future operations.

For any of the foregoing embodiments, the system may include any one of the following elements, alone or in combination with each other:

The permeability determination module can calculate a permeability of sand $k_{sd}$ in the earthen formation 118 based on the tri-axial permeability components $k_x,k_y,k_z$, the isotropic permeability $k_e$, and a laminated shale volume $V_{lam}$ A laminated shale volume $V_{lam}$ (which is a percentage of shale in a volume of the earthen formation 118) and the sand permeability $k_{sd}$ can be determined based on the tri-axial permeability components $k_x,k_y,k_z$, the isotropic permeability $k_e$, and shale permeability constants $k_{sh}^x$, $k_{sh}^y$, $k_{sh}^z$ from a log profile of the borehole 116. The permeability determination module 1508 can calculate tri-axial permeability components $k_x,k_y,k_z$ based at least in part on the isotropic permeability $k_e$ data and ratios of the inverted 3D resistivity parameters $R_x$, $R_y$, and $R_z$. The calculations of the tri-axial permeability components $k_x,k_y,k_z$ can include compensations for shale compaction effects. The sensor 127 can be chosen from a group consisting of a nuclear magnetic resonance (NMR) sensor, multi-pole sonic logging (MSL) sensor, and a resistivity sensor.

Furthermore, the illustrative methods described herein may be implemented by a system comprising processing circuitry that can include a non-transitory computer readable medium comprising instructions which, when executed by at least one processor of the processing circuitry, causes the processor to perform any of the methods described herein.

Although various embodiments have been shown and described, the disclosure is not limited to such embodiments and will be understood to include all modifications and variations as would be apparent to one skilled in the art. Therefore, it should be understood that the disclosure is not intended to be limited to the particular forms disclosed; rather, the intention is to cover all modifications, equivalents, and alternatives falling within the spirit and scope of the disclosure as defined by the appended claims.

The invention claimed is:

1. A method of determining permeability of an earthen formation that has been penetrated by a borehole, the method comprising:
   positioning a sensor in the borehole;
   measuring, via the sensor, characteristics of the earthen formation, and logging the characteristics;
   determining an effective permeability based on the logged characteristics;
   positioning a logging tool in the borehole;
   measuring, via the logging tool, three dimensional (3D) multi-component induction (MCI) data;
   determining 3D resistivity components of the earthen formation by inverting the 3D MCI data;
   logging the 3D resistivity components;
   determining tri-axial permeability components based on the effective permeability and the logged 3D resistivity components;
   determining a sand permeability of sand in the earthen formation, based at least in part on the tri-axial permeability components, the effective permeability, and a laminated shale volume;
   logging the sand permeability; and
   initiating a modification to a borehole operation based on the sand permeability.

2. The method of claim 1, further comprising initiating a modification to at least one of a group consisting of a borehole drilling operation, a borehole production operation, a borehole injection operation, and a borehole logging operation in response to the logged sand permeability.

3. The method of claim 1, wherein the determining of the tri-axial permeability components further comprises performing an iterative inversion operation on the 3D MCI data.

4. The method of claim 1, wherein the logging tool comprises a multicomponent induction measurement device that measures the 3D MCI data.

5. The method of claim 1, wherein the effective permeability represents an isotropic permeability of a laminated region in the earthen formation, wherein the isotropic permeability is measured by the sensor.

6. The method of claim 1, wherein the determining the tri-axial permeability components further comprises calculating one of the tri-axial permeability components for each one of x-axis, y-axis, and z-axis directions in a shale formation.

7. The method of claim 6, wherein the determining the tri-axial permeability components further comprises calculating ratios between pairs of the tri-axial permeability components.

8. The method of claim 1, further comprising generating a visualization of the tri-axial permeability components for display on a display device.

9. The method of claim 1, wherein the sensor is at least one of a group consisting of a nuclear magnetic resonance (NMR) sensor, multi-pole sonic logging (MSL) sensor, and a resistivity sensor.

10. The method of claim 1, further comprising generating a visualization of the sand permeability for display on a display device.

11. The method of claim 10, further comprising initiating a modification to at least one of a group consisting of a borehole drilling operation, a borehole production operation, a borehole injection operation, and a borehole logging operation in response to displaying the sand permeability.

12. A system for determining permeability of an earthen formation that has been penetrated by a borehole, the system comprising:
   a data access module to access three dimensional (3D) multicomponent induction (MCI) data captured by a logging tool and isotropic permeability data captured by a sensor in the borehole;
   an inversion module that calculates inverted 3D resistivity parameters by performing an iterative inversion operation of the 3D MCI data;
   a permeability determination module that calculates tri-axial permeability components based at least in part on the isotropic permeability data and the inverted 3D resistivity parameters; and
   a display device that generates a visualization of the tri-axial permeability components.

13. The system according to claim 12, wherein the permeability determination module calculates a permeability of sand in the earthen formation, based on the tri-axial permeability components, the isotropic permeability data, and a laminated shale volume.

14. The system according to claim 13, wherein laminated shale volume and the sand permeability are determined based on the tri-axial permeability components, the isotropic permeability data, and permeability constants from a log profile of the borehole.

15. The system according to claim 12, wherein the permeability determination module calculates tri-axial permeability components based at least in part on the isotropic permeability data and ratios of the inverted 3D resistivity parameters.

16. The system according to claim 15, wherein calculations of the tri-axial permeability components include compensations for shale compaction effects.

17. The system according to claim 12, wherein the sensor is at least one of a group consisting of a nuclear magnetic resonance (NMR) sensor, a multi-pole sonic logging (MSL) sensor, and a resistivity sensor.

18. A method of determining sand permeability in a laminated sand-shale formation, the method comprising:
   drilling a borehole through an earthen formation, wherein the earthen formation includes the laminated sand-shale formation;
   measuring parameters of the laminated sand-shale formation with a sensor positioned in the borehole and logging the parameters;
   determining an effective permeability based on the logged parameters;
   measuring three dimensional (3D) multicomponent induction (MCI) data of the laminated sand-shale formation with an MCI logging tool;
   calculating 3D resistivity components from the 3D MCI data;
   determining tri-axial permeability components based on the effective permeability and a percentage of shale that is present in a volume of the laminated sand-shale formation;
   determining the sand permeability based at least in part on the tri-axial permeability components, the effective permeability, and the percentage of shale;
   logging the sand permeability; and
   initiating a modification to a borehole operation based on the sand permeability.

19. The method of claim 18, the method further comprising initiating a modification to at least one of a group consisting of a borehole drilling operation, a borehole production operation, a borehole injection operation, and a borehole logging operation in response to the logged sand permeability.

20. The method of claim 18, wherein the effective permeability represents an isotropic permeability of the laminated sand-shale formation, wherein the isotropic permeability is measured by the sensor.

21. The method of claim 18, wherein the determining the tri-axial permeability components further comprises calculating one of the tri-axial permeability components for each one of x-axis, y-axis, and z-axis directions in a shale formation.

* * * * *